United States Patent
Endo

(10) Patent No.: US 10,578,284 B2
(45) Date of Patent: Mar. 3, 2020

(54) SUPPORT OF FLEXIBLE COMPONENT AND LIGHT-EMITTING DEVICE

(71) Applicant: Semiconductor Energy Laboratory Co., Ltd., Atsugi-shi, Kanagawa-ken (JP)

(72) Inventor: Akio Endo, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/797,420

(22) Filed: Oct. 30, 2017

(65) Prior Publication Data

US 2018/0058665 A1 Mar. 1, 2018

Related U.S. Application Data

(63) Continuation of application No. 15/171,159, filed on Jun. 2, 2016, now Pat. No. 9,810,406, which is a
(Continued)

(30) Foreign Application Priority Data

Jul. 19, 2013 (JP) ................................. 2013-150236

(51) Int. Cl.
*F21V 15/04* (2006.01)
*F21V 21/30* (2006.01)
(Continued)

(52) U.S. Cl.
CPC ............. *F21V 15/04* (2013.01); *F16M 11/38* (2013.01); *F16M 13/00* (2013.01); *F21V 21/30* (2013.01);
(Continued)

(58) Field of Classification Search
CPC ......... F21V 15/04; F21V 21/30; F16M 11/38; F16M 13/00; H01L 27/323;
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| AU | 2012261906 | 10/2016 |
| CN | 103620516 A | 3/2014 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Anita M King
(74) *Attorney, Agent, or Firm* — Robinson Intellectual Property Law Office; Eric J. Robinson

(57) ABSTRACT

To provide a support for supporting a flexible component and a light-emitting device. A first substrate, a second substrate, a rack, a pinion, and a hinge are provided. When the second substrate is moved, the rotational force of the pinion is transmitted to the rack of the first substrate and thus the first substrate is moved in the horizontal direction while being overlapped with one of hinge pieces of the hinge; accordingly, the flexible component can be bent while the flexible component is fixed to the first substrate and the second substrate and the allowable curvature radius is maintained in the vicinity of the hinge.

22 Claims, 16 Drawing Sheets

Related U.S. Application Data continuation of application No. 14/330,520, filed on Jul. 14, 2014, now Pat. No. 9,395,070.

(51) Int. Cl.
  *H01L 27/32* (2006.01)
  *F16M 11/38* (2006.01)
  *F16M 13/00* (2006.01)
  *F21Y 115/10* (2016.01)
  *F21Y 115/15* (2016.01)
  *H01L 27/12* (2006.01)

(52) U.S. Cl.
  CPC ........ *H01L 27/323* (2013.01); *H01L 27/3262* (2013.01); *F21Y 2115/10* (2016.08); *F21Y 2115/15* (2016.08); *H01L 27/1225* (2013.01); *H01L 2227/326* (2013.01); *H01L 2251/5338* (2013.01)

(58) Field of Classification Search
  CPC ............. H01L 27/3262; H01L 27/1225; H01L 2227/326; H01L 2251/5338; F21Y 2115/10; F21Y 2115/15
  See application file for complete search history.

(56) References Cited

U.S. PATENT DOCUMENTS

| | | |
|---|---|---|
| 6,294,274 B1 | 9/2001 | Kawazoe et al. |
| 6,377,324 B1 | 4/2002 | Katsura |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,477,464 B2 | 7/2013 | Visser et al. |
| 8,597,965 B2 | 12/2013 | Hatano et al. |
| 8,803,816 B2 | 8/2014 | Kilpatrick, II et al. |
| 8,836,611 B2 | 9/2014 | Kilpatrick, II et al. |
| 8,860,632 B2 | 10/2014 | Kilpatrick, II et al. |
| 8,860,765 B2 | 10/2014 | Kilpatrick, II et al. |
| 8,863,038 B2 | 10/2014 | King et al. |
| 8,866,840 B2 | 10/2014 | Dahl et al. |
| 8,933,874 B2 | 1/2015 | Lundqvist et al. |
| 8,947,320 B2 | 2/2015 | King et al. |
| 8,971,031 B2 | 3/2015 | Mok et al. |
| 9,009,984 B2 | 4/2015 | Caskey et al. |
| 9,013,864 B2 * | 4/2015 | Griffin ................ H04M 1/0216 16/382 |
| 9,176,535 B2 | 11/2015 | Bohn et al. |
| D745,006 S | 12/2015 | Hirakatay et al. |
| D750,036 S | 2/2016 | Endo et al. |
| 9,857,844 B2 * | 1/2018 | Tsukamoto ........... G06F 1/1652 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0032210 A1 | 2/2003 | Takayama et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0122671 A1 | 6/2005 | Homer |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0146488 A1 | 7/2006 | Kimmel |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042940 A1 | 2/2008 | Hasegawa |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0066643 A1 | 3/2010 | King et al. |
| 2010/0092800 A1 | 4/2010 | Itagaki et al. |
| 2010/0109002 A1 | 5/2010 | Itagaki et al. |
| 2010/0277448 A1 | 11/2010 | Okamoto et al. |
| 2011/0241998 A1 | 10/2011 | Mckinney et al. |
| 2012/0286312 A1 | 11/2012 | Hatano et al. |
| 2012/0307423 A1 | 12/2012 | Bohn et al. |
| 2013/0037228 A1 | 2/2013 | Verschoor et al. |

(56) References Cited

U.S. PATENT DOCUMENTS

| | | | |
|---|---|---|---|
| 2015/0016126 A1* | 1/2015 | Hirakata | F21V 15/012 362/418 |
| 2015/0023030 A1 | 1/2015 | Tsukamoto | |
| 2015/0261259 A1* | 9/2015 | Endo | G06F 1/1652 361/679.06 |

FOREIGN PATENT DOCUMENTS

| | | |
|---|---|---|
| EP | 1737044 A | 12/2006 |
| EP | 2226847 A | 9/2010 |
| EP | 2584128 A | 4/2013 |
| EP | 3190476 A | 7/2017 |
| JP | 60-198861 A | 10/1985 |
| JP | 62-236981 A | 10/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-137379 A | 6/1991 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-174153 A | 6/2003 |
| JP | 2003-520998 | 7/2003 |
| JP | 2003-298700 A | 10/2003 |
| JP | 2004-103957 A | 4/2004 |
| JP | 2004-273614 A | 9/2004 |
| JP | 2004-273732 A | 9/2004 |
| JP | 2006-105271 A | 4/2006 |
| JP | 2007-219071 A | 8/2007 |
| JP | 2009-110366 A | 5/2009 |
| JP | 2010-530553 | 9/2010 |
| JP | 2010-256660 A | 11/2010 |
| JP | 2011-216786 A | 10/2011 |
| JP | 2011-221189 A | 11/2011 |
| JP | 2012-502321 | 1/2012 |
| JP | 2012-251572 A | 12/2012 |
| JP | 2012-253014 A | 12/2012 |
| JP | 2013-050547 A | 3/2013 |
| JP | 2014-519626 | 8/2014 |
| KR | 2014-0026547 A | 3/2014 |
| TW | 201250645 | 12/2012 |
| WO | WO-1999/034348 | 7/1999 |
| WO | WO-2001/053919 | 7/2001 |
| WO | WO-2004/114391 | 12/2004 |
| WO | WO-2008/153402 | 12/2008 |
| WO | WO-2010/028394 | 3/2010 |
| WO | WO-2010/028397 | 3/2010 |
| WO | WO-2010/028399 | 3/2010 |
| WO | WO-2010/028402 | 3/2010 |
| WO | WO-2010/028403 | 3/2010 |
| WO | WO-2010/028404 | 3/2010 |
| WO | WO-2010/028405 | 3/2010 |
| WO | WO-2010/028406 | 3/2010 |
| WO | WO-2010/028407 | 3/2010 |
| WO | WO-2012/049968 | 4/2012 |
| WO | WO-2012/167204 | 12/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39. pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 839-842.

(56) References Cited

OTHER PUBLICATIONS

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFe2O4, and YB2Fe3O7 Types of Structures for Compounds in the In2O3 and Sc2O3-A2O3-BO Systems [A; Fe, Ga, or Al; B: Mg, Mn, Fe, Ni, Cu,or Zn]at Temperatures Over 1000° C", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al "World's Largest (15-Inch) XGA AMLCD Panel Using IGZO Oxide TFT", SID Digest '08 SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID DIGEST '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155. No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Translstors by Ar Plasma Treatment", Appl. Phys. Lett. (Applied Physics Letters) , Jun. 26, 2007, vol. 90, No. 26, pp. 262106-1-282106-3.

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Dismay", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

(56) References Cited

OTHER PUBLICATIONS

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

SUPPORT OF FLEXIBLE COMPONENT AND LIGHT-EMITTING DEVICE

BACKGROUND OF THE INVENTION

1. Field of the Invention

One embodiment of the present invention relates to a support of a flexible component, and a light-emitting device.

Note that one embodiment of the present invention is not limited to the above technical field. The technical field of one embodiment of the present invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

In recent years, research and development have been extensively conducted on light-emitting elements utilizing electroluminescence (EL). In a basic structure of such a light-emitting element, a layer containing a light-emitting substance is interposed between a pair of electrodes. By applying voltage to the element, light emission from the light-emitting substance can be obtained.

The above light-emitting element is a self-luminous element; thus, a light-emitting device including the light-emitting element has advantages such as high visibility, no necessity of a backlight, and low power consumption. In addition, the light-emitting device has advantages in that it can be manufactured to be thin and lightweight and has fast response speed.

Since a light-emitting device including the above light-emitting element can have flexibility, use of the light-emitting device for a flexible substrate has been proposed.

As a method for manufacturing a light-emitting device using a flexible substrate, a technology in which a separation layer is formed over a substrate, e.g., a glass substrate or a quartz substrate, a semiconductor element such as a thin film transistor is formed over the separation layer, and then, the semiconductor element is transferred to another substrate (e.g., a flexible substrate) has been developed (see Patent Document 1).

REFERENCE

Patent Document

[Patent Document 1] Japanese Published Patent Application No. 2003-174153

SUMMARY OF THE INVENTION

Components such as a light-emitting device formed over a flexible substrate can improve portability by being folded utilizing their flexibility. On the other hand, sufficient mechanical strength cannot be obtained because of their small thicknesses. For these reasons, a support having sufficient mechanical strength is preferably provided to protect the flexible component from external damage or unexpected shock in carrying.

Although the flexible component can be bent to a certain degree, an internal structure is physically broken when the flexible component is bent with an extremely small curvature radius. For that reason, even when the support is used for protection, a bendable region of the flexible component has to maintain the allowable curvature radius.

For example, a foldable support includes two boards connected by a hinge, and one flexible component (e.g., a light-emitting device) is across the two boards in a state where the support is opened. Here, to fold the support safely without breaking the flexible component, it is necessary to maintain the allowable curvature radius of the flexible component in the vicinity of the hinge.

Maintaining the curvature radius can be easily achieved without devising the hinge in the following manner: the flexible component is fixed to one of the two boards connected by the hinge and fixed to the other board so as to be slid in the horizontal direction. However, the design is poor and the reliability is decreased.

Thus, an object of one embodiment of the present invention is to provide a support for supporting a flexible component. Another object is to provide a support for performing bending operation without decreasing the reliability of a flexible component. Another object is to provide a support for maintaining the allowable curvature radius of a flexible component. Another object is to provide a support for improving the reliability of a flexible component. Another object is to provide a support for suppressing a decrease in electrical characteristics of a flexible component. Another object is to provide a novel support of a flexible component. Another object is to provide a novel light-emitting device.

Note that the description of these objects does not disturb the existence of other objects. In one embodiment of the present invention, there is no need to achieve all the objects. Other objects will be apparent from and can be derived from the description of the specification, the drawings, the claims, and the like.

The present invention relates to a support of a flexible component, a support of a flexible component for performing bending operation stably without breaking the flexible component, and a light-emitting device including the flexible component. Note that the support of the flexible component serves as a protector of the flexible component in some cases depending on the purpose or situations.

According to one embodiment of the present invention, a support of a flexible component includes a first substrate, a second substrate, a rack, a pinion, and a hinge. The rack is fixed to a corner of the first substrate. A center of the pinion is fixed to a shaft of the hinge. A slide function is provided in one of hinge pieces of the hinge. The shaft of the hinge is fixed to the other of the hinge pieces of the hinge. The hinge is provided over the first substrate and the second substrate so that teeth of the rack and teeth of the pinion engage with each other in a state where the second substrate is adjacent to the side of the corner of the first substrate to which the rack is fixed. The first substrate and the one of the hinge pieces of the hinge are fixed to each other in a state where the first substrate can be moved in a horizontal direction with the slide function while being overlapped with the one of the hinge pieces of the hinge. The second substrate and the other of the hinge pieces of the hinge are fixed to each other. When the second substrate is moved, a rotational force of the pinion is transmitted to the rack, and thus the first substrate is moved in the horizontal direction while being overlapped with the one of the hinge pieces of the hinge.

Note that in this specification and the like, ordinal numbers such as "first" and "second" are used in order to avoid confusion among components and do not limit the components numerically.

One flexible component can be fixed to the support of the flexible component across the first substrate and the second substrate, and bending operation can be performed without breaking the flexible component.

The first substrate and the second substrate can be connected to each other with two sets of the hinge and peripheral components (a rack, a pinion, and the like).

According to another embodiment of the present invention, a support of a flexible component includes a first substrate, a second substrate, a third substrate, a first rack, a second rack, a first pinion, a second pinion, a third pinion, an intermediate gear, a first hinge, and a second hinge. The first rack is fixed to a corner of the second substrate. A center of the first pinion is fixed to a shaft of the first hinge. A shaft of the first hinge is fixed to one of hinge pieces of the first hinge. A first slide function is provided in the other of the hinge pieces of the first hinge. The first hinge is provided over the first substrate and the second substrate so that teeth of the first rack and teeth of the second pinion engage with each other in a state where the first substrate is adjacent to the side of the corner of the second substrate to which the first rack is fixed. The second substrate and the other of the hinge pieces of the first hinge are fixed to each other in a state where the second substrate can be moved in a horizontal direction with the first slide function while being overlapped with the other of the hinge pieces of the first hinge. The first substrate and the one of the hinge pieces of the first hinge are fixed to each other. The second rack is fixed to a corner of the third substrate. A center of the second pinion is fixed to a shaft which is fixed to one of hinge pieces of the second hinge. A center of the third pinion is fixed to a shaft which is fixed to the other of the hinge pieces of the second hinge. Teeth of the second pinion and teeth of the third pinion engage with each other through the intermediate gear. A center of the intermediate gear is fixed to the shaft which is fixed to the one of the hinge pieces of the second hinge. A second slide function is provided in the one of the hinge pieces of the second hinge. The second hinge is provided over the second substrate and the third substrate so that teeth of the second rack and teeth of the second pinion engage with each other in a state where the side of the second substrate which is opposite to the side of the second substrate to which the first hinge is fixed is adjacent to the side of the corner of the third substrate to which the second rack is fixed. The third substrate and the one of the hinge pieces of the second hinge are fixed to each other in a state where the third substrate can be moved in a horizontal direction with the second slide function while being overlapped with the one of the hinge pieces of the second hinge. The second substrate and the other of the hinge pieces of the second hinge are fixed to each other. When the first substrate is moved, a rotational force of the first pinion is transmitted to the first rack, and thus the second substrate is moved in the horizontal direction while being overlapped with the other of the hinge pieces of the first hinge. When the second substrate is moved, a rotational force of the third pinion is transmitted to the second rack through the intermediate gear and the second pinion, and thus the third substrate is moved in the horizontal direction while being overlapped with the one of the hinge pieces of the second hinge.

One flexible component can be fixed to the support of the flexible component across the first substrate, the second substrate, and the third substrate, and bending operation can be performed without breaking the flexible component.

The first substrate and the second substrate can be connected to each other with two sets of the first hinge and peripheral components (a first rack, a first pinion, and the like), and the second substrate and the third substrate can be connected to each other with two sets of the second hinge and peripheral components (a second rack, a second pinion, a third pinion, and the like).

According to another embodiment of the present invention, a light-emitting device includes a first substrate, a second substrate, a rack, a pinion, a hinge, and a flexible light-emitting device. The rack is fixed to a corner of the first substrate. A center of the pinion is fixed to a shaft of the hinge. A slide function is provided in one of hinge pieces of the hinge. The shaft of the hinge is fixed to the other of the hinge pieces of the hinge. The hinge is provided over the first substrate and the second substrate so that teeth of the rack and teeth of the pinion engage with each other in a state where the second substrate is adjacent to the side of the corner of the first substrate to which the rack is fixed. The first substrate and the one of the hinge pieces of the hinge are fixed to each other in a state where the first substrate can be moved in a horizontal direction with the slide function while being overlapped with the one of the hinge pieces of the hinge. The second substrate and the other of the hinge pieces of the hinge are fixed to each other. The flexible light-emitting device is fixed across the first substrate and the second substrate. When the second substrate is moved, a rotational force of the pinion is transmitted to the rack, and thus the first substrate is moved in the horizontal direction while being overlapped with the one of the hinge pieces of the hinge.

According to another embodiment of the present invention, a light-emitting device includes a first substrate, a second substrate, a third substrate, a first rack, a second rack, a first pinion, a second pinion, a third pinion, an intermediate gear, a first hinge, a second hinge, and a flexible light-emitting device. The first rack is fixed to a corner of the second substrate. A center of the first pinion is fixed to a shaft of the first hinge. A shaft of the first hinge is fixed to one of hinge pieces of the first hinge. A first slide function is provided in the other of the hinge pieces of the first hinge. The first hinge is provided over the first substrate and the second substrate so that teeth of the first rack and teeth of the second pinion engage with each other in a state where the first substrate is adjacent to the side of the corner of the second substrate to which the first rack is fixed. The second substrate and the other of the hinge pieces of the first hinge are fixed to each other in a state where the second substrate can be moved in a horizontal direction with the first slide function while being overlapped with the other of the hinge pieces of the first hinge. The first substrate and the one of the hinge pieces of the first hinge are fixed to each other. The second rack is fixed to a corner of the third substrate. A center of the second pinion is fixed to a shaft which is fixed to one of hinge pieces of the second hinge. A center of the third pinion is fixed to a shaft which is fixed to the other of the hinge pieces of the second hinge. Teeth of the second pinion and teeth of the third pinion engage with each other through the intermediate gear. A center of the intermediate gear is fixed to the shaft which is fixed to the one of the hinge pieces of the second hinge. A second slide function is provided in the one of the hinge pieces of the second hinge. The second hinge is provided over the second substrate and the third substrate so that teeth of the second rack and teeth of the second pinion engage with each other in a state where the side of the second substrate which is opposite to the side of the second substrate to which the first hinge is fixed is adjacent to the side of the corner of the third substrate to which the second rack is fixed. The third substrate and the one of the hinge pieces of the second hinge are fixed to each other in a state where the third substrate can be moved in a horizontal direction with the second slide function while being overlapped with the one of the hinge pieces of the second hinge. The second substrate and the other of the hinge pieces of the second hinge are fixed to each other. The flexible light-emitting device is fixed across the first substrate, the second substrate, and the third substrate. When the first substrate is moved, a rotational force of the first pinion is transmitted to the first rack, and thus the second substrate is moved in the horizontal direction while being overlapped with the other of the hinge pieces of the first hinge. When the second substrate is moved, a rotational force of the third pinion is transmitted to the second rack through the intermediate gear and the second pinion, and thus the third substrate is moved in the horizontal direction while being overlapped with the one of the hinge pieces of the second hinge.

As the flexible light-emitting device, a display device or a lighting device using an organic EL element can be used.

According to one embodiment of the present invention, a support for supporting a flexible component can be provided. A support for performing bending operation without decreasing the reliability of a flexible component can be provided. A support for maintaining the allowable curvature radius of a flexible component can be provided. A support for improving the reliability of a flexible component can be provided. A support for suppressing a decrease in electrical characteristics of a flexible component can be provided. A novel support of a flexible component can be provided. A novel light-emitting device can be provided.

Note that the description of these effects does not disturb the existence of other effects. In one embodiment of the present invention, there is no need to achieve all the effects. Other objects will be apparent from and can be derived from the description of the specification, the drawings, the claims, and the like.

DETAILED DESCRIPTION OF THE INVENTION

Figure 1:
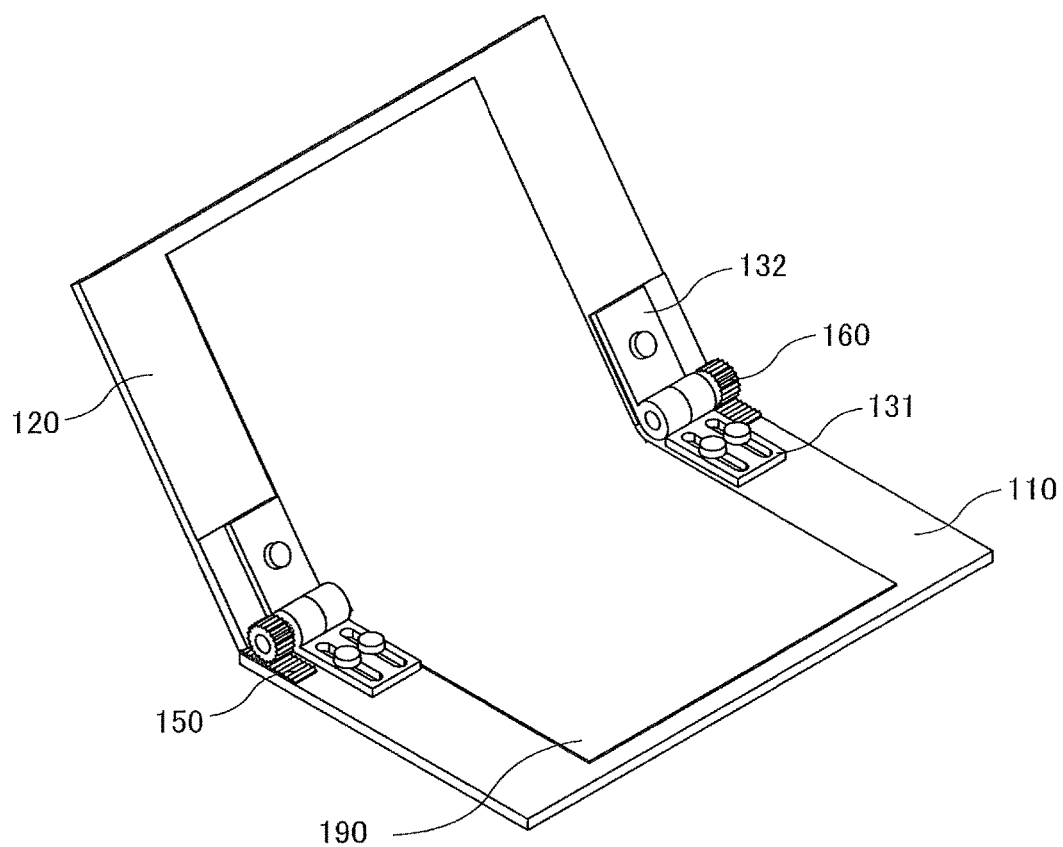
FIG. 1 is a perspective view illustrating a support for supporting a flexible component.

Embodiments will be described in detail with reference to drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated in some cases.

Embodiment 1

In this embodiment, a support of a flexible component of one embodiment of the present invention is described. The support of one embodiment of the present invention can be used for general components with low resistance to bending, and the components are not limited to electrical components.

Figure 2A:
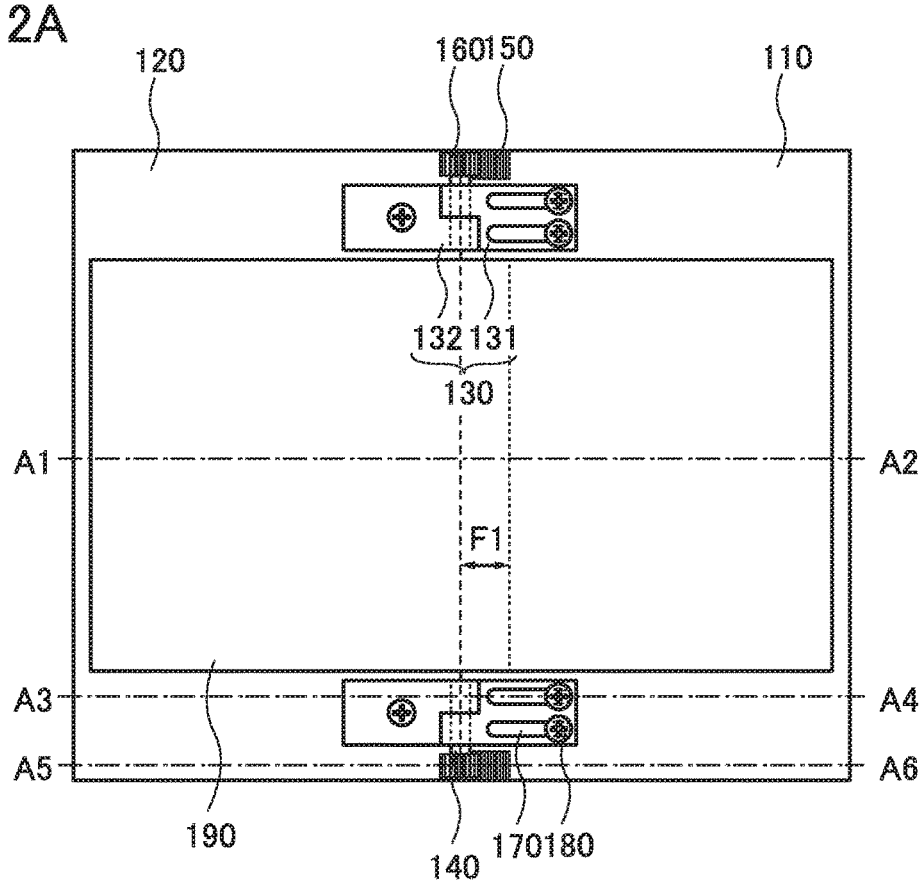
FIGS. 2A to 2D are a top view and cross-sectional views illustrating a support for supporting a flexible component.
Figure 2B:
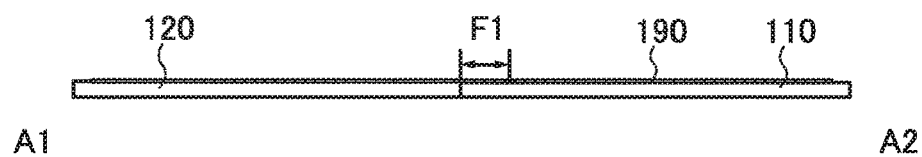
Figure 2C:
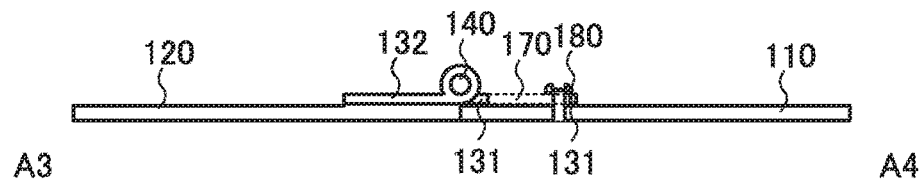
Figure 2D:
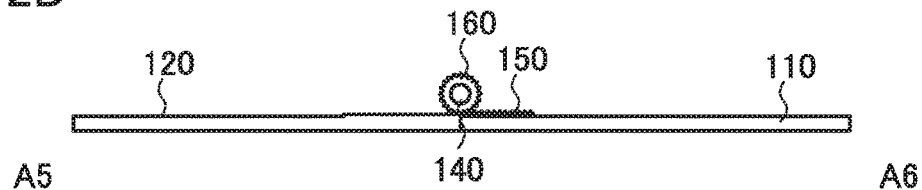

FIG. 1 is a perspective view of a support of a flexible component of one embodiment of the present invention which can be opened and closed, in a state where the flexible component is opened so that a hinge forms an obtuse angle. FIGS. 2A to 2D illustrate a state where the support is opened so that the flexible component is flat. FIG. 2A is a top view (of a side on which the flexible component is provided), FIG. 2B is a cross-sectional view taken along line A1-A2 in FIG. 2A, FIG. 2C is a cross-sectional view taken along line A3-A4 in FIG. 2A, and FIG. 2D is a cross-sectional view taken along line A5-A6 in FIG. 2A.

The support of the flexible component of one embodiment of the present invention includes a first substrate 110, a second substrate 120, a hinge 130, a rack 150, and a pinion 160. FIG. 2A illustrates a structure in which the first substrate 110 and the second substrate 120 are connected to each other with two hinges which are provided to be line-symmetric with respect to the line A1-A2 (a center line dividing the drawing to an upper part and a lower part). The two hinges are the same except being mirror images. Thus, the description of only one of the hinges and the like is made below.

The rack 150 is fixed to a corner of the first substrate 110, and the center of the pinion 160 is fixed to a shaft 140 of the hinge 130. Furthermore, the shaft 140 is fixed to a hinge piece 132 of the hinge 130. In other words, the operation of the hinge piece 132 is transmitted to the pinion 160 through the shaft 140.

In a state where the second substrate 120 is adjacent to the side of the corner of the first substrate 110 to which the rack 150 is fixed, the hinge 130 is placed over the first substrate 110 and the second substrate 120 so that teeth of the rack 150 and teeth of the pinion 160 engage with each other (see FIG. 2D).

A slide function is provided in a hinge piece 131 of the hinge 130, and with the slide function, the first substrate 110 and the hinge piece 131 of the hinge 130 are fixed to each other in a state where the first substrate 110 can be moved in the horizontal direction while being overlapped with the hinge piece 131 of the hinge 130 (see FIG. 2C). Furthermore, the second substrate 120 and the hinge piece 132 of the hinge 130 are fixed to each other.

In one embodiment of the present invention, there is no limitation on the structure of the slide function. For example, as illustrated in the drawings, the slide function can be formed using slotted holes 170 in the hinge piece 131 of the hinge 130 and jigs 180 (e.g., screws) inserted to the slotted holes and fixed to the first substrate. The slotted holes may be formed on the first substrate side. In addition, as the slide function, a function in which upper and lower tables are overlapped with each other with a bearing, a low friction material, or the like provided therebetween can be used.

Although two slotted holes 170 are provided in the hinge piece 131 of the hinge 130 here, one slotted hole 170 may be provided.

The flexible component 190 in regions other than a region F1 illustrated in FIGS. 2A and 2B can be fixed to the first substrate 110 and the second substrate 120. The region F1 corresponds to a bendable region of the flexible component 190, and it is necessary that the first substrate 110 and the flexible component 190 are not fixed to each other in the region F1.

Figure 3A:
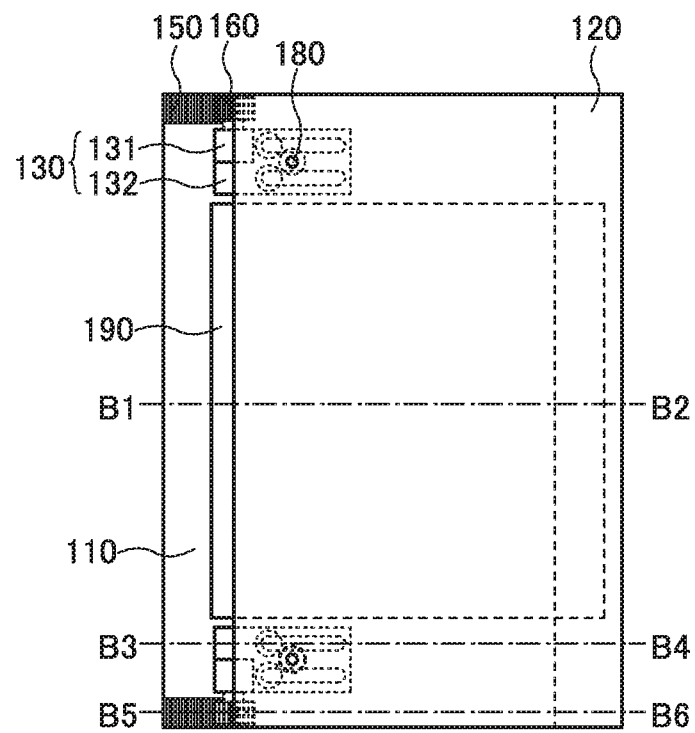
FIGS. 3A to 3D are a top view and cross-sectional views illustrating a support for supporting a flexible component.
Figure 3B:
Figure 3C:
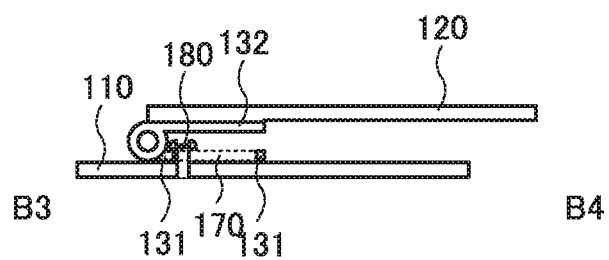
Figure 3D:
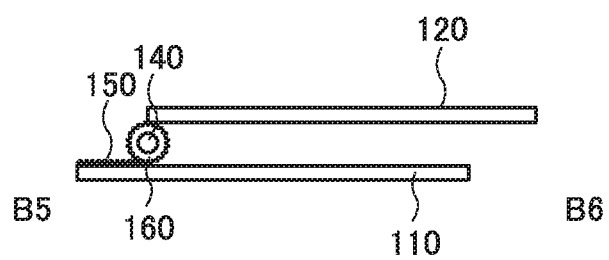

FIGS. 3A to 3D illustrate a state where the support illustrated in FIG. 1 is closed. FIG. 3A is a top view, FIG. 3B is a cross-sectional view taken along line B1-B2 in FIG. 3A, FIG. 3C is a cross-sectional view taken along line B3-B4 in FIG. 3A, and FIG. 3D is a cross-sectional view taken along line B5-B6 in FIG. 3A.

When the second substrate 120 is moved in the support having the above structure, the rotational force of the pinion 160 is transmitted to the rack 150, and the first substrate 110 can be moved in the horizontal direction while being overlapped with the hinge piece 131 of the hinge 130. The same operation can be performed also in such a manner that the first substrate 110 is moved or both of the substrates are moved.

Thus, even when the flexible component 190 is fixed to the first substrate 110 and the second substrate 120 as illustrated in FIG. 2B, the support can be bent while the curvature radius of the bendable portion is kept constant as illustrated in FIG. 3B. Note that the allowable curvature radius of the bendable portion of the flexible component 190 can be adjusted by selecting the diameter of a tube covering the shaft 140 of the hinge 130 and the diameter of the pinion 160.

Figure 4A:
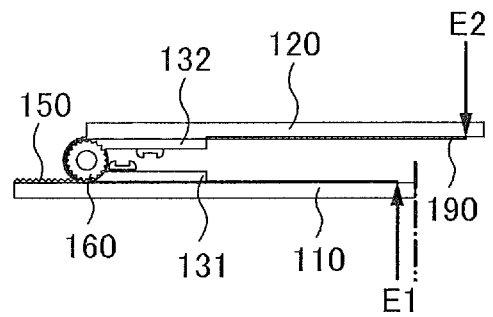
FIGS. 4A to 4C are cross-sectional views illustrating a support for supporting a flexible component.
Figure 4B:
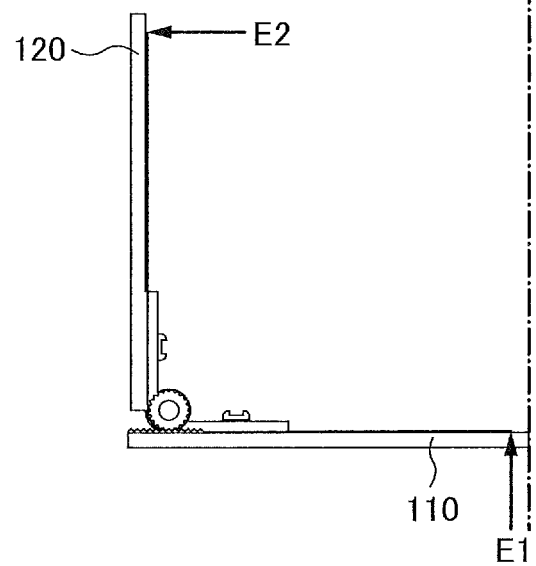
Figure 4C:
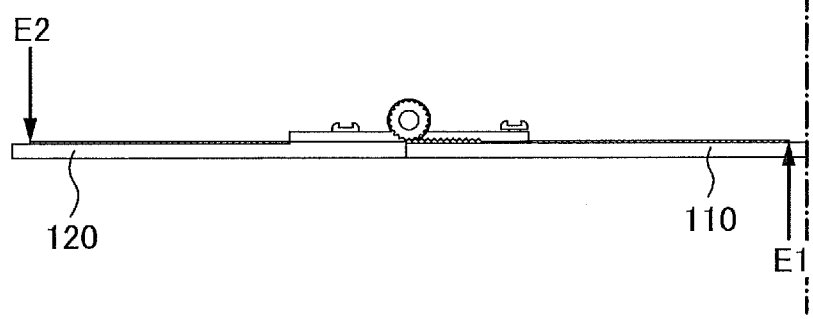

FIGS. 4A to 4C are side views illustrating a state of the support of one embodiment of the present invention from closed to opened. Here, when an end of the flexible component 190 on the first substrate 110 side is referred to as E1 and an end of the flexible component 190 on the second substrate 120 side is referred to as E2, the positions of the ends E1 and E2 are not changed due to opening and closing of the support.

In other words, in the support of one embodiment of the present invention, the flexible component 190 other than the bendable portion can be fixed to the first substrate 110 and the second substrate 120. Thus, the flexible component 190 can have high mechanical strength, and thus the reliability can be improved. The surface shapes of the first substrate 110 and the second substrate 120 can be reflected in the flexible component 190 thus, the function or design can be improved. For example, in the case where the flexible component 190 is a display device and the surface shapes of the first substrate 110 and the second substrate 120 are flat, the visibility can be improved.

Figure 5A:
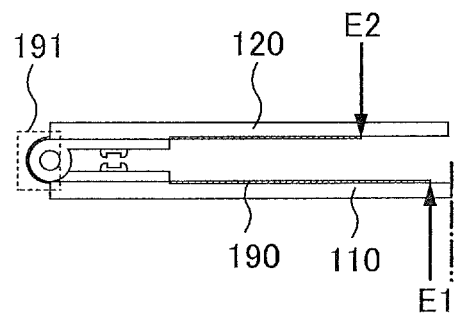
FIGS. 5A to 5C are cross-sectional views illustrating a support for supporting a flexible component.
Figure 5B:
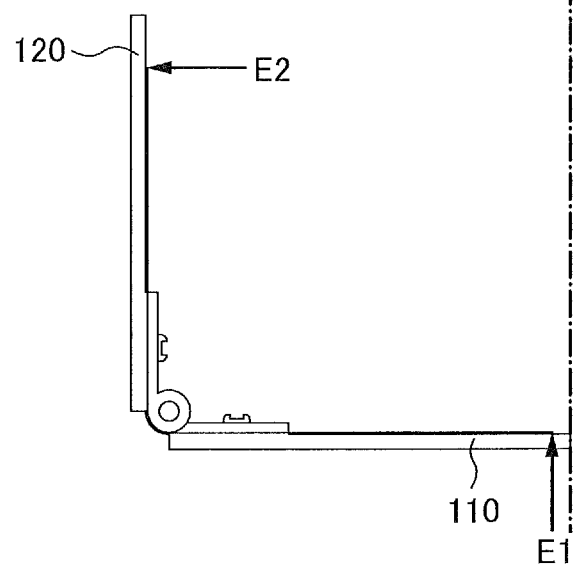
Figure 5C:
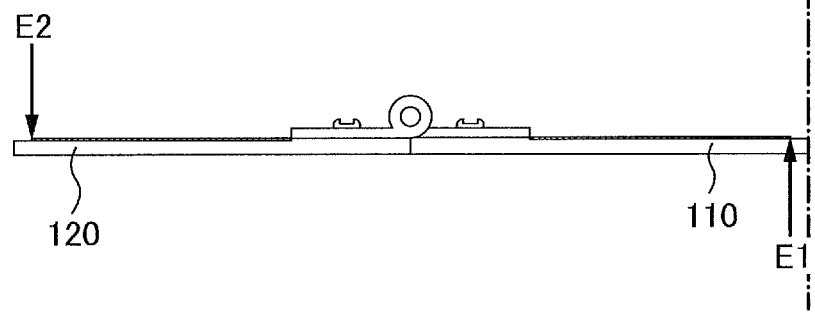

As a reference example, FIGS. 5A to 5C illustrate a state of a support which is not one embodiment of the present invention from closed to opened. FIGS. 5A to 5C are side views illustrating states of the support from closed to opened. The support illustrated in FIGS. 5A to 5C does not include a rack, a pinion, and a slide function, and is different from the one embodiment of the present invention in that the first substrate 110 cannot be moved in the horizontal direction.

In the support illustrated in FIGS. 5A to 5C, the flexible component 190 is fixed to the first substrate 110, not to the second substrate 120. Here, in opening and closing of the support, the position of the end E1 of the flexible component 190 is not changed; on the other hand, the position of the end E2 of the flexible component 190 is changed according to the degree of opening and closing of the support.

This is because a region 191 which is part of the flexible component 190 is used as a bendable portion as illustrated in FIG. 5A. When the support is changed from the state in FIG. 5B to that in FIG. 5A, the flexible component 190 is moved over the second substrate 120 to be pulled in the hinge direction, and thus the position of the end E2 of the flexible component 190 is changed. When the support is changed from the state in FIG. 5B to that in FIG. 5C, the flexible component 190 is moved over the second substrate 120 in a direction opposite to the hinge direction, and thus the position of the end E2 of the flexible component 190 is changed.

Since the flexible component 190 cannot be fixed to the second substrate 120 in the support illustrated in FIGS. 5A to 5C, it is difficult to improve the mechanical strength. Friction is caused between the second substrate 120 and the flexible component; thus, the mechanical or electrical reliability is decreased in some cases. Furthermore, since the surface shape of the second substrate 120 cannot be reflected in the flexible component 190, it is difficult to improve the function and design sufficiently.

Thus, according to one embodiment of the present invention, a flexible component with excellent reliability, function, and design can be provided.

Note that components such as a gear or a hinge described in this specification are merely examples, and the shapes, numbers, and the like thereof are not limited. Other components having functions similar to those of the gear and the hinge described in this specification may be used instead thereof.

This embodiment can be implemented in an appropriate combination with any of the structures described in the other embodiments.

Embodiment 2

In this embodiment, a support of a flexible component of one embodiment of the present invention, which is different from Embodiment 1, is described. Although the double-fold support is described in Embodiment 1, a triple-fold support is described in this embodiment.

Figure 6A:
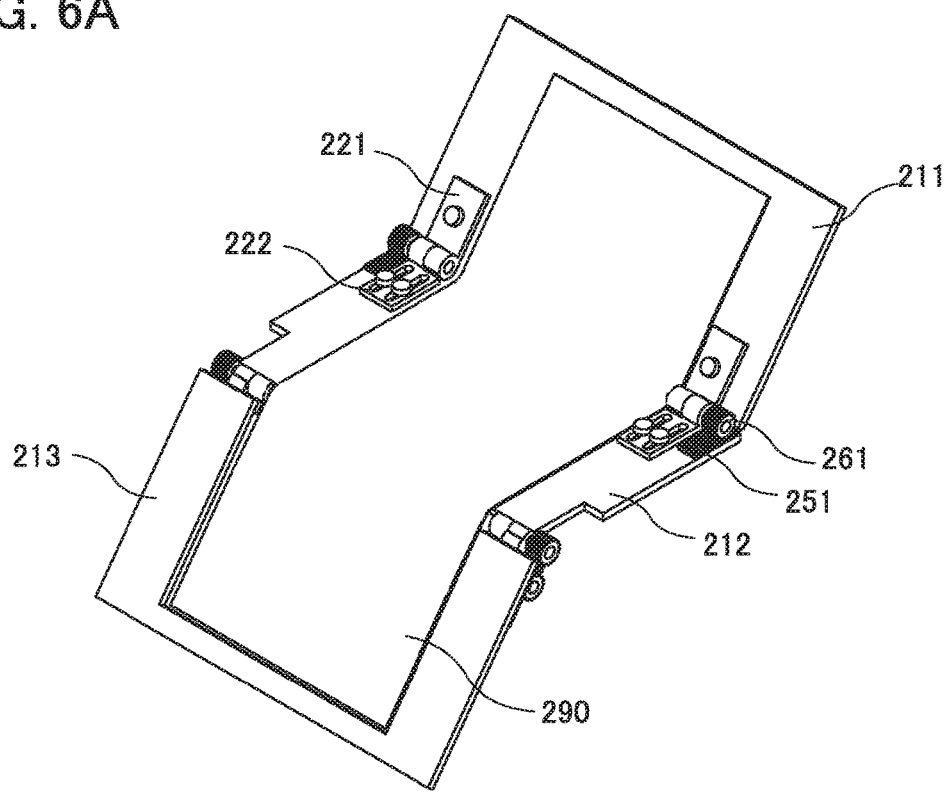
FIGS. 6A and 6B are perspective views illustrating a support for supporting a flexible component.
Figure 6B:
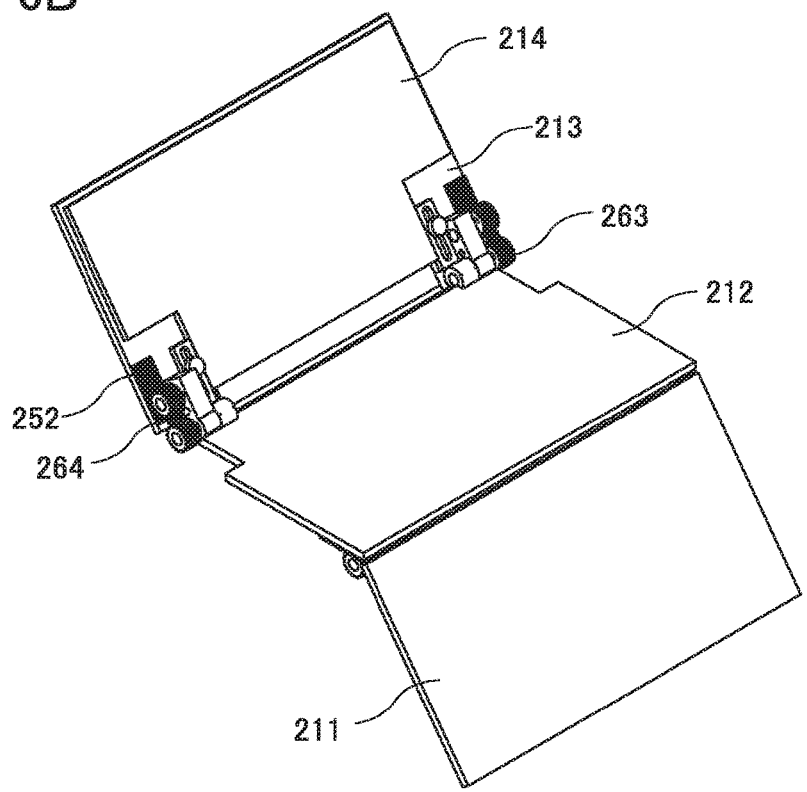

FIGS. 6A and 6B are perspective views of the support of the flexible component of one embodiment of the present invention that can be opened and closed when the support is opened in a state where each hinge forms an obtuse angle. FIG. 6A illustrates the side on which the flexible component is provided, and FIG. 6B illustrates the opposite side of FIG.

Figure 7A:
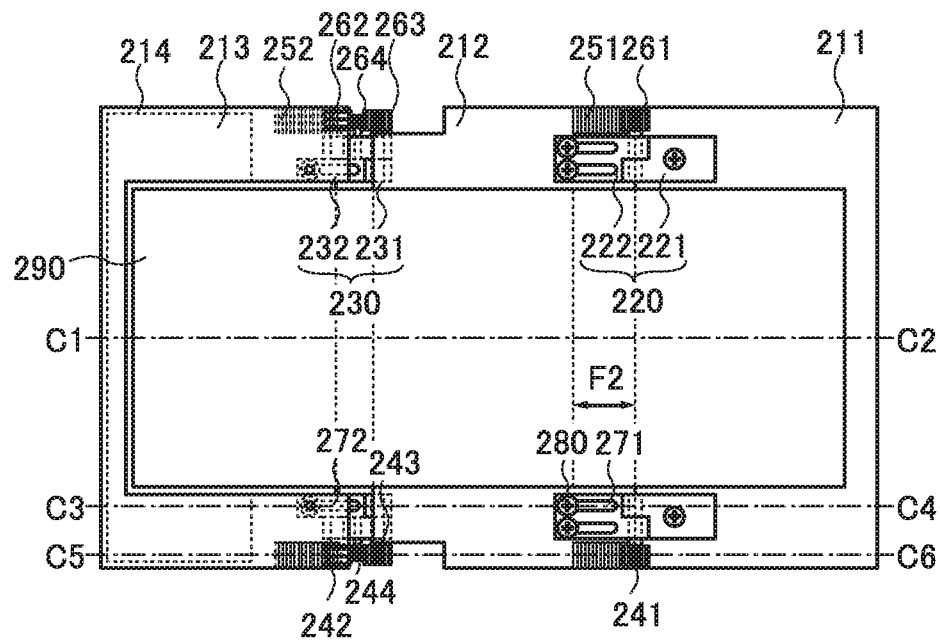
FIGS. 7A to 7D are a top view and cross-sectional views illustrating a support for supporting a flexible component.
Figure 7B:
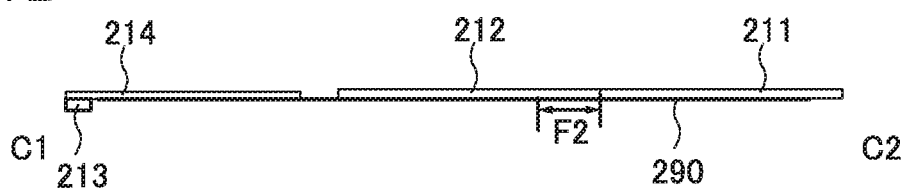
Figure 7C:
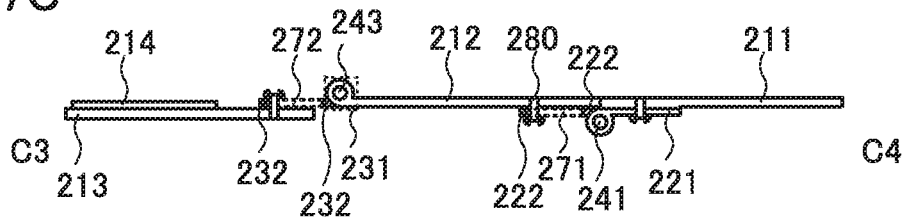
Figure 7D:
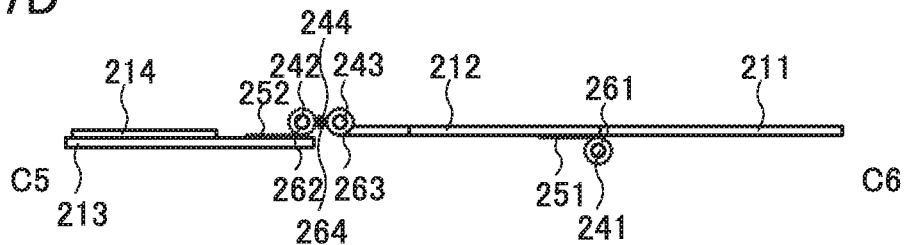

6A. FIGS. 7A to 7D illustrate a state where the support of the flexible component of one embodiment of the present invention that can be opened and closed. FIG. 7A is a top view (of a side on which the flexible component is provided), FIG. 7B is a cross-sectional view taken along line C1-C2 in FIG. 7A, FIG. 7C is a cross-sectional view taken along line C3-C4 in FIG. 7A, and FIG. 7D is a cross-sectional view taken along line C5-C6 in FIG. 7A.

The support of the flexible component of one embodiment of the present invention includes a first substrate 211, a second substrate 212, a third substrate 213, a first hinge 220, a first rack 251, a second rack 252, a first pinion 261, a second pinion 262, a third pinion 263, and an intermediate gear 264. FIG. 7A illustrates a structure in which the first substrate 211, the second substrate 212, and the third substrate 213 are connected with two pairs of hinges (four hinges in total) which are provided to he line-symmetric with respect to the line C1-C2 (a center line dividing the drawing to an upper part and a lower part). The two hinges which connect the first substrate 211 and the second substrate 212 are the same except being mirror images. Furthermore, the two hinges which connect the second substrate 212 and the third substrate 213 are the same except being mirror images. Thus, the description of only one of the hinges which are the same is made below.

The first rack 251 is fixed to a corner of the second substrate 212, and the center of the first pinion 261 is fixed to a shaft 241 of the first hinge 220. The shaft 241 is fixed to a hinge piece 221 of the first hinge 220. In other words, the operation of the hinge piece 221 is transmitted to the first pinion 261 through the shaft 241.

In a state where the first substrate 211 is adjacent to the side of the corner of the second substrate 212 to which the first rack 251 is fixed, the first hinge 220 is placed over the first substrate 211 and the second substrate 212 so that teeth of the first rack 251 and teeth of the first pinion 261 engage with each other (see FIG. 7D).

A first slide function is provided in a hinge piece 222 of the first hinge 220, and with the first slide function, the second substrate 212 and the hinge piece 222 of the first hinge 220 are fixed to each other in a state where the second substrate 212 can be moved in the horizontal direction while being overlapped with the hinge piece 222 of the first hinge 220 (see FIG. 7C). Furthermore, the first substrate 211 and the hinge piece 221 of the first hinge 220 are fixed to each other.

In one embodiment of the present invention, there is no limitation on the structure of the first slide function. For example, as illustrated in the drawings, slotted holes 271 are formed in the hinge piece 222 of the first hinge 220, and can be formed using the jigs 280 (e.g., screws) inserted into the slotted holes. Note that the description of the slide function in Embodiment 1 can be referred to for the first slide function.

Although two slotted holes 271 are provided in the hinge piece 222 of the first hinge 220 here, one slotted hole 271 may be provided.

A flexible component 290 in regions other than a region F2 illustrated in FIGS. 7A and 7B can be fixed to the first substrate 211, the second substrate 212, and the third substrate 213. The region F2 corresponds to a bendable region of the flexible component 290, and it is necessary that the second substrate 212 and the flexible component 290 are not fixed to each other in the region F2.

The second rack 252 is fixed to a corner of the third substrate 213, and the center of the second pinion 262 is fixed to a shaft 242 fixed to the hinge piece 232 of the second hinge 230. The center of the third pinion 263 is fixed to a shaft 243 fixed to the hinge piece 231 of the second hinge 230. The second pinion 262 and the third pinion 263 engage with each other through the intermediate gear 264. The center of the intermediate gear is fixed to a shaft fixed to the hinge piece 232 of the second hinge 230. With such a structure, the operation of the hinge piece 231 is transmitted to the third pinion 263 through the shaft 243, and the operation of the third pinion 263 is transmitted to the second pinion 262 through an intermediate gear 244.

In a state where the side of the second substrate 212 to which the first hinge 220 is fixed is adjacent to the side of the corner of the third substrate 213 to which the second rack 252 is fixed, the second hinge 230 is placed over the second substrate 212 and the third substrate 213 so that teeth of the second rack 252 and teeth of the second pinion 262 engage with each other (see FIG. 7D).

A second slide function is provided in the hinge piece 232 of the second hinge 230, and the third substrate 213 and the hinge piece 232 of the second hinge 230 are fixed to each other in a state where the third substrate 213 can be moved in the horizontal direction while being overlapped with the hinge piece 232 of the second hinge 230 (see FIG. 7C). Furthermore, the second substrate 212 and the hinge piece 231 of the second hinge 230 are fixed to each other.

In one embodiment of the present invention, there is no limitation on the structure of the second slide function. For example, as illustrated in the drawings, slotted holes 272 are formed in the hinge piece 232 of the second hinge 230, and can be formed using the jigs 280 (e.g., screws) inserted into the slotted holes. Note that the description of the slide function in Embodiment 1 can be referred to for the second slide function.

Although one slotted hole 272 is provided in the hinge piece 232 of the second hinge 230 here, two slotted holes 272 may be provided.

A fourth substrate 214 is fixed to the third substrate 213. Actually, the flexible component 290 is fixed to the fourth substrate 214. Note that if the third substrate 213 and the fourth substrate 214 are regarded as one substrate, the description can be made assuming that the flexible component 290 is fixed to the third substrate 213.

Furthermore, the corner of the second substrate 212 is partly removed so that when the flexible component is folded, the second pinion 262, the third pinion 263, and the intermediate gear 264 do not interfere with each other.

Although FIGS. 7A to 7D illustrate the structure in which the hinge piece 231 of the second hinge 230 is formed in the second substrate 212, the structure in which the hinge piece 231 is fixed to the second substrate 212 as described above may be employed.

Figure 16A:
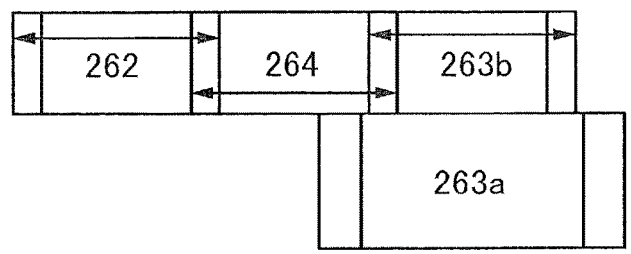
FIGS. 16A and 16B illustrate gears.
Figure 16B:
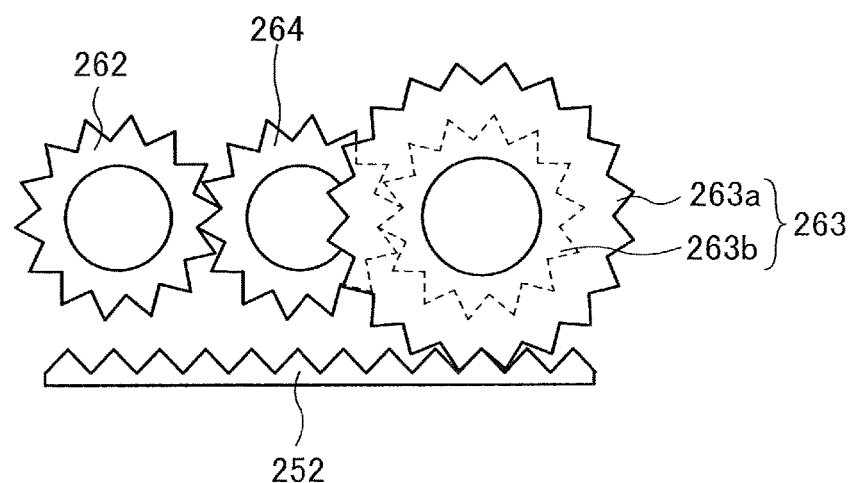

Alternatively, the second pinion 262, the third pinion 263, and the intermediate gear 264 may have a structure illustrated in FIGS. 16A and 16B. FIG. 16A is a top view and FIG. 16B is a cross-sectional view.

The third pinion 263 includes a gear 263a and a gear 263b. The second pinion 262 and the gear 263b engage with each other through the intermediate gear 264. Furthermore, the second rack 252 engages with only the gear 263a.

Figure 8A:
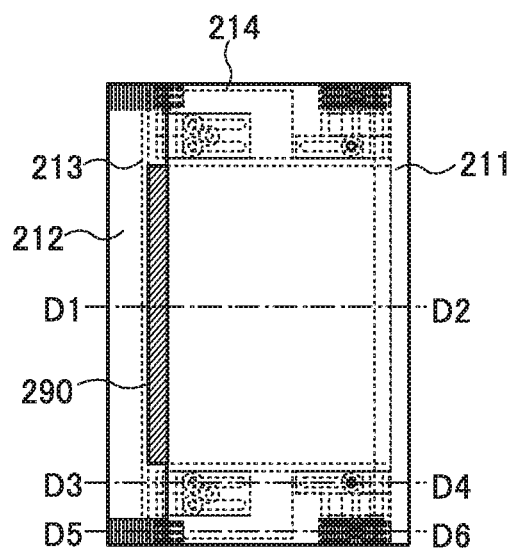
FIGS. 8A to 8D are a top view and cross-sectional views illustrating a support for supporting a flexible component.
Figure 8B:
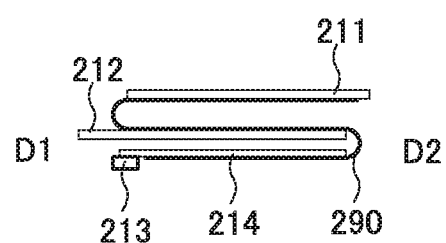
Figure 8C:
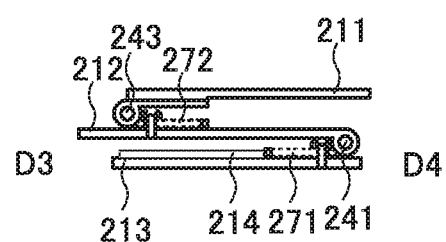
Figure 8D:
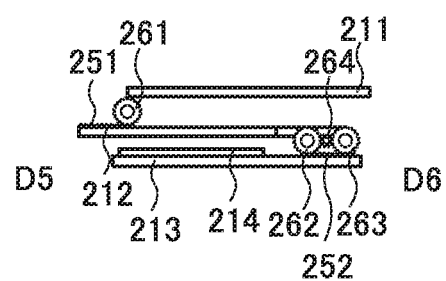
Figure 9A:
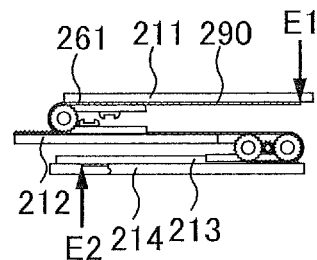
FIGS. 9A to 9D are cross-sectional views illustrating a support for supporting a flexible component.
Figure 9B:
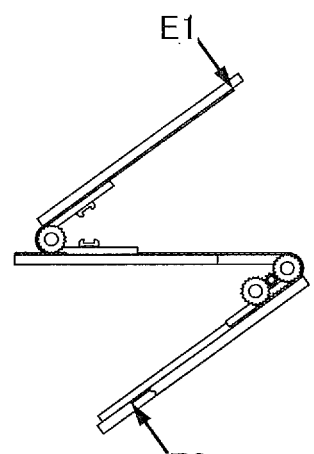
Figure 9C:
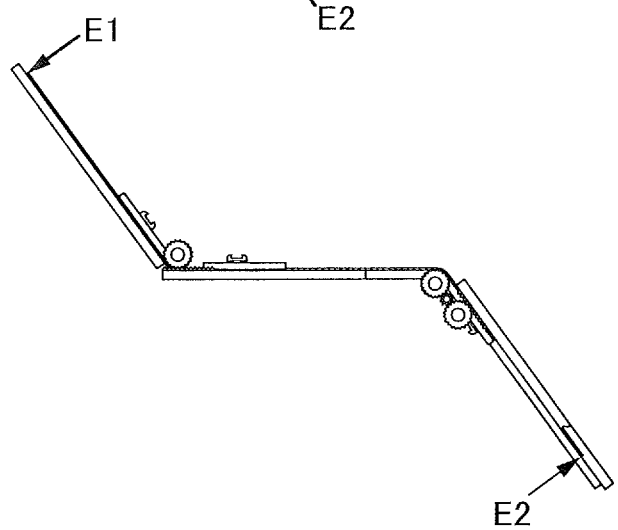
Figure 9D:
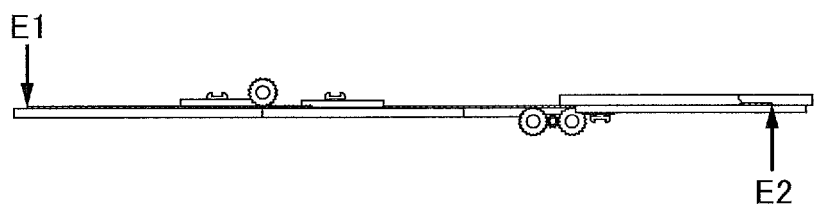

FIGS. 8A to 8D illustrate a state where the support illustrated in FIGS. 6A and 6B is closed. FIG. 8A is a top view, FIG. 8B is a cross-sectional view taken along line D1-D2 in FIG. 8A. FIG. 8C is a cross-sectional view taken along line D3-D4 in FIG. 8A, and FIG. 8D is a cross-sectional view taken along line D5-D6 in FIG. 8A.

When the first substrate 211 is moved in the support having the above structure, the rotational force of the first pinion 261 is transmitted to the first rack 251, and the second substrate 212 can be moved in the horizontal direction while being overlapped with the hinge piece 222 of the first hinge 220.

When the second substrate 212 is moved, the rotational force of the third pinion 263 is transmitted to the second rack 252 through the intermediate gear 264 and the second pinion 262, and the third substrate 213 can be moved in the horizontal direction while being overlapped with the hinge piece 232 of the second hinge 230. Note that moving the substrate corresponds to opening and closing of the support, and the opening and closing of the support can be performed by moving either of the substrates.

Thus, even in a state where the flexible component 290 is fixed to the first substrate 211, the second substrate 212, and the third substrate 213 (the fourth substrate 214) as illustrated in FIG. 7B, the support can be bent as illustrated in FIG. 8B while keeping the curvature radius of the bendable portion. The allowable curvature radius of the bendable portion of the flexible component 290 can be adjusted by selecting the diameter of a tube covering the shaft 241 of the first hinge 220, the diameter of the first pinion 261, the diameter of a tube covering the shaft 243 of the second hinge 230, and the diameter of the third pinion 263.

FIGS. 9A to 9D are side views illustrating a state of a support of one embodiment of the present invention from closed to opened. Note that part of the third substrate 213 is seen transparently in FIGS. 9A to 9D. Here, when an end of the flexible component 290 on the first substrate 211 side is referred to as E1 and an end of the flexible component 290 on the third substrate 213 side is referred to as E2, the positions of the ends E1 and E2 are not changed due to opening and closing of the support.

In other words, in the support of one embodiment of the present invention, the flexible component 290 is fixed to the first substrate 211, the second substrate 212, and the third substrate 213 (the fourth substrate 214); thus, the flexible component 290 can have high mechanical strength, and thus the reliability can be improved. Furthermore, the surface shapes of the first substrate 211, the second substrate 212, and the third substrate 213 (the fourth substrate 214) can be reflected in the flexible component 290; thus, the function and design can be improved. For example, in the case where the flexible component 290 is a display device and the surface shapes of the first substrate 211, the second substrate 212, and the third substrate 213 (the fourth substrate 214) are flat, the visibility can be improved.

Thus, according to one embodiment of the present invention, a flexible component with excellent reliability, function, and design can be provided. In addition, according to one embodiment of the present invention, the flexible component can be folded small, and thus can have excellent portability.

This embodiment can be implemented in an appropriate combination with any of the structures described in the other embodiments.

Embodiment 3

In this embodiment, examples of a light-emitting device (light-emitting panel) which can be used as the flexible components described in Embodiments 1 and 2 are described.

Specific Example 1

Figure 10A:
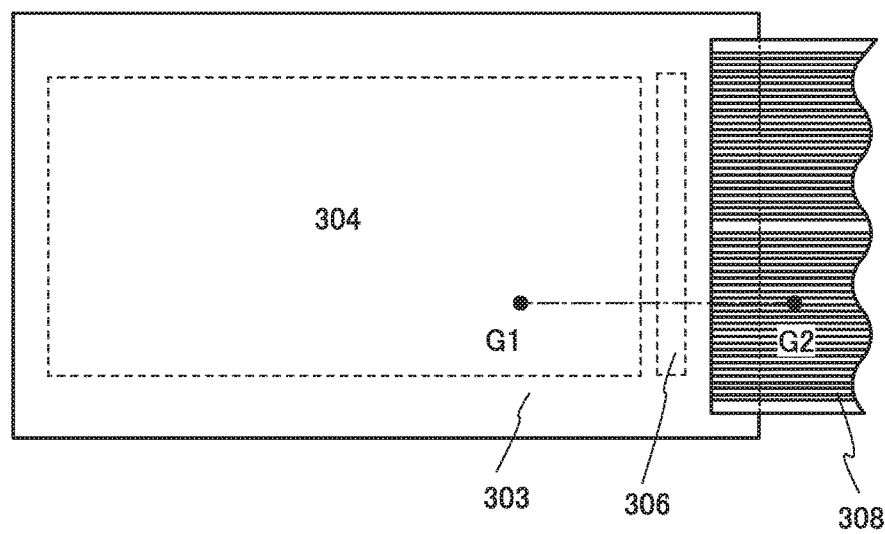
FIGS. 10A and 10B illustrate a light-emitting panel.
Figure 10B:
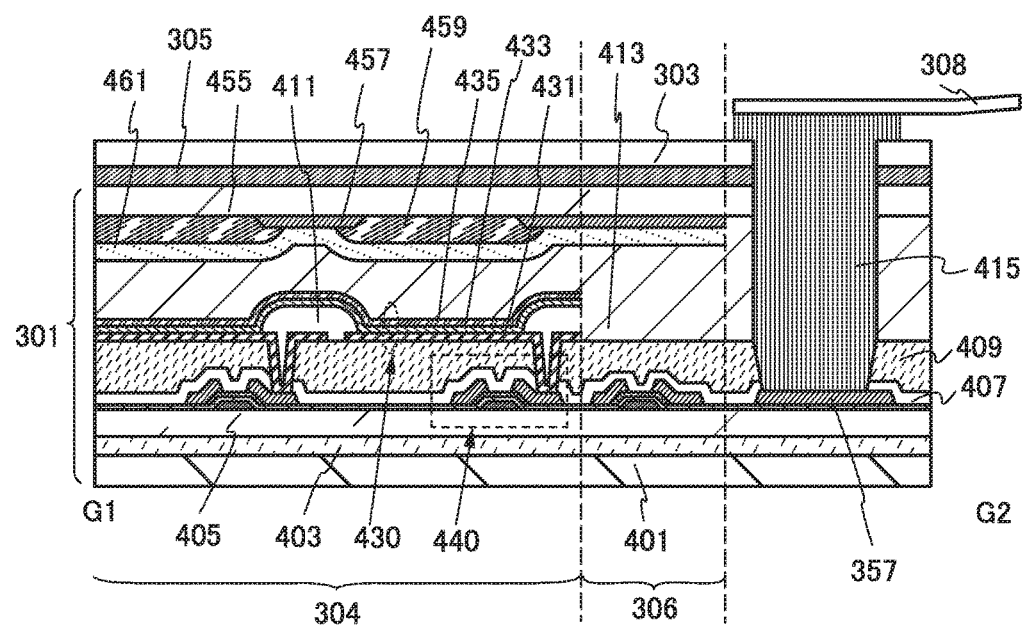

FIG. 10A is a plan view of the light-emitting panel which can be used as an example of the flexible component, and FIG. 10B is an example of a cross-sectional view taken along dashed-dotted line G1-G2 in FIG. 10A.

The light-emitting panel shown in FIG. 10B includes an element layer 301, a bonding layer 305, and a substrate 303. The element layer 301 includes a substrate 401, a bonding layer 403, an insulating layer 405, a transistor 440, a conductive layer 357, an insulating layer 407, an insulating layer 409, a light-emitting element 430, an insulating layer 411, a sealing layer 413, an insulating layer 461, a coloring layer 459, a light-blocking layer 457, and an insulating layer 455.

The conductive layer 357 is electrically connected to an FPC 308 via a connector 415.

A light-emitting element 430 includes a lower electrode 431, an EL layer 433, and an upper electrode 435. The lower electrode 431 is electrically connected to a source electrode or a drain electrode of a transistor 440. An end portion of the lower electrode 431 is covered with the insulating layer 411. The light-emitting element 430 has a top emission structure. The upper electrode 435 has a light-transmitting property and transmits light emitted from the EL layer 433.

The coloring layer 459 is provided to overlap with the light-emitting element 430, and the light-blocking layer 457 is provided to overlap with the insulating layer 411. The coloring layer 459 and the light-blocking layer 457 are covered with the insulating layer 461. The space between the light-emitting element 430 and the insulating layer 461 is filled with the sealing layer 413.

The light-emitting panel includes a plurality of transistors in a light extraction portion 304 and a driver circuit portion 306. The transistor 440 is provided over the insulating layer 405. The insulating layer 405 and the substrate 401 are attached to each other with the bonding layer 403. The insulating layer 455 and the substrate 303 are attached to each other with the bonding layer 305. It is preferable to use films with low water permeability for the insulating layer 405 and the insulating layer 455, in which case an impurity such as water can be prevented from entering the light-emitting element 430 or the transistor 440, leading to improved reliability of the light-emitting panel. The bonding layer 403 can be formed using a material similar to that of the bonding layer 305.

The light-emitting panel in Specific Example 1 can be manufactured in the following manner: the insulating layer 405, the transistor 440, and the light-emitting element 430 are formed over a formation substrate with high heat resistance; the formation substrate is separated; and the insulating layer 405, the transistor 440, and the light-emitting element 430 are transferred to the substrate 401 and attached thereto with the bonding layer 403. The light-emitting panel in Specific Example 1 can be manufactured in the following manner: the insulating layer 455, the coloring layer 459, and the light-blocking layer 457 are formed over a formation substrate with high heat resistance; the formation substrate is separated; and the insulating layer 455, the coloring layer 459, and the light-blocking layer 457 are transferred to the substrate 303 and attached thereto with the bonding layer 305.

In the case where a material with high water permeability and low heat resistance (e.g., resin) is used for a substrate, it is impossible to expose the substrate to high temperature in the manufacturing process. Thus, there is a limitation on conditions for forming a transistor and an insulating film over the substrate. In the manufacturing method of this embodiment, a transistor and the like can be formed over a formation substrate having high heat resistance; thus, a highly reliable transistor and an insulating film with sufficiently low water permeability can be formed. Then, the transistor and the insulating film are transferred to the substrate 303 or the substrate 401, whereby a highly reliable light-emitting panel can be manufactured. Thus, with one embodiment of the present invention, a thin or/and light-weight light-emitting device with high reliability can be provided. Details of the manufacturing method will be described later.

The substrate 303 and the substrate 401 are each preferably formed using a material with high toughness. Thus, a display device with high impact resistance that is less likely to be broken can be provided. For example, when the substrate 303 is an organic resin substrate and the substrate 401 is a substrate formed using a thin metal material or a thin alloy material, a light-emitting panel that is more lightweight and less likely to be broken as compared with the case where a glass substrate is used can be provided.

A metal material and an alloy material, which have high thermal conductivity, are preferred because they can easily conduct heat to the whole substrate and accordingly can prevent a local temperature rise in the light-emitting panel. The thickness of a substrate using a metal material or an alloy material is preferably greater than or equal to 10 μm and less than or equal to 200 μm, further preferably greater than or equal to 20 μm and less than or equal to 50 μm.

Further, when a material with high thermal emissivity is used for the substrate 401, the surface temperature of the light-emitting panel can be prevented from rising, leading to prevention of breakage or a decrease in reliability of the light-emitting panel. For example, the substrate 401 may have a stacked structure of a metal substrate and a layer with high thermal emissivity (the layer can be formed using a metal oxide or a ceramic material, for example).

Specific Example 2

Figure 11A:
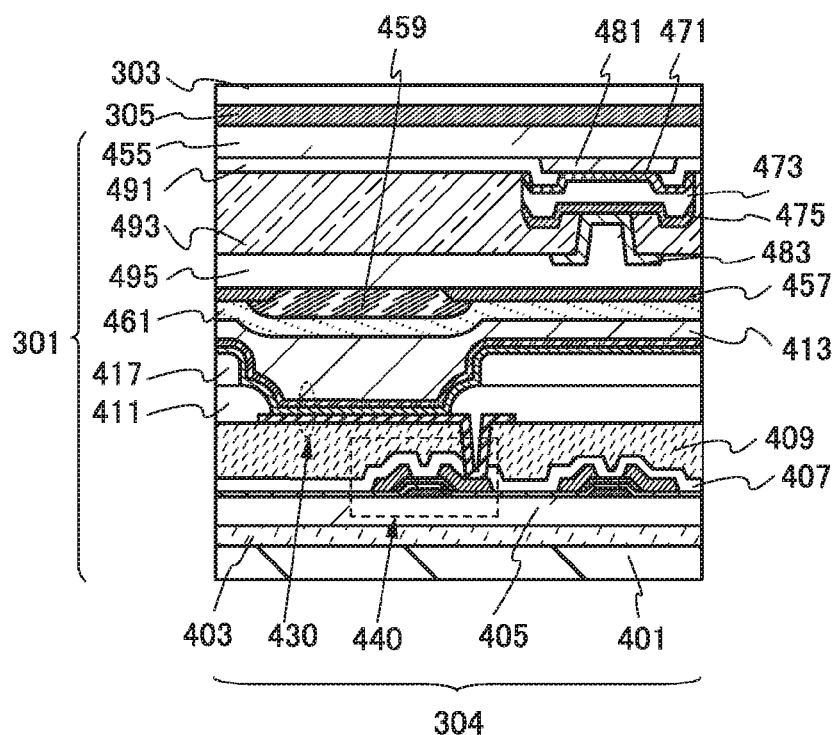
FIGS. 11A and 11B each illustrate a light-emitting panel.

FIG. 11A shows another example of the light extraction portion 304 in the light-emitting panel. The light-emitting panel shown in FIG. 11A is capable of touch operation. In the following specific examples, description of components similar to those in Specific Example 1 is omitted.

The light-emitting panel shown in FIG. 11A includes the element layer 301, the bonding layer 305, and the substrate 303. The element layer 301 includes the substrate 401, the bonding layer 403, the insulating layer 405, the transistor 440, the insulating layer 407, the insulating layer 409, the light-emitting element 430, the insulating layer 411, an insulating layer 417, the sealing layer 413, the insulating layer 461, the coloring layer 459, the light-blocking layer 457, a light-receiving element, a conductive layer 481, a conductive layer 483, an insulating layer 491, an insulating layer 493, an insulating layer 495, and the insulating layer 455.

Specific Example 2 includes the insulating layer 417 over the insulating layer 411. The space between the substrate 303 and the substrate 401 can be adjusted with the insulating layer 417.

FIG. 11A shows an example in which a light-receiving element is provided between the insulating layer 455 and the sealing layer 413. Since the light-receiving element can be placed to overlap with a non-light-emitting region (e.g., a region where the transistor 440 or a wiring is provided) on the substrate 401 side, the light-emitting panel can be provided with a touch sensor without a decrease in the aperture ratio of a pixel (light-emitting element).

As the light-receiving element included in the light-emitting panel, for example, a pn photodiode or a pin photodiode can be used. In this embodiment, a pin photodiode including a p-type semiconductor layer 471, an i-type semiconductor layer 473, and an n-type semiconductor layer 475 is used as the light-receiving element.

Note that the i-type semiconductor layer 473 is a semiconductor in which the concentration of each of an impurity imparting p-type conductivity and an impurity imparting n-type conductivity is $1 \times 10^{20}$ cm$^{-3}$ or less and which has photoconductivity 100 times or more as high as dark conductivity. The i-type semiconductor layer 473 also includes, in its category, a semiconductor that contains an impurity element belonging to Group 13 or Group 15 of the periodic table. In other words, since an i-type semiconductor has weak n-type electric conductivity when an impurity element for controlling valence electrons is not added intentionally, the i-type semiconductor layer 473 includes, in its category, a semiconductor to which an impurity element imparting p-type conductivity is added intentionally or unintentionally at the time of deposition or after the deposition.

The light-blocking layer 457 is closer to the substrate 303 than the light-receiving element is, and overlaps with the light-receiving element. The light-blocking layer 457 between the light-receiving element and the sealing layer 413 can prevent the light-receiving element from being irradiated with light emitted from the light-emitting element 430.

The conductive layer 481 and the conductive layer 483 are electrically connected to the light-receiving element. The conductive layer 481 preferably transmits light incident on the light-receiving element. The conductive layer 483 preferably blocks light incident on the light-receiving element.

It is preferable to provide an optical touch sensor between the substrate 303 and the sealing layer 413 because the optical touch sensor is less likely to be affected by light emitted from the light-emitting element 430 and can have improved S/N ratio.

Specific Example 3

Figure 11B:
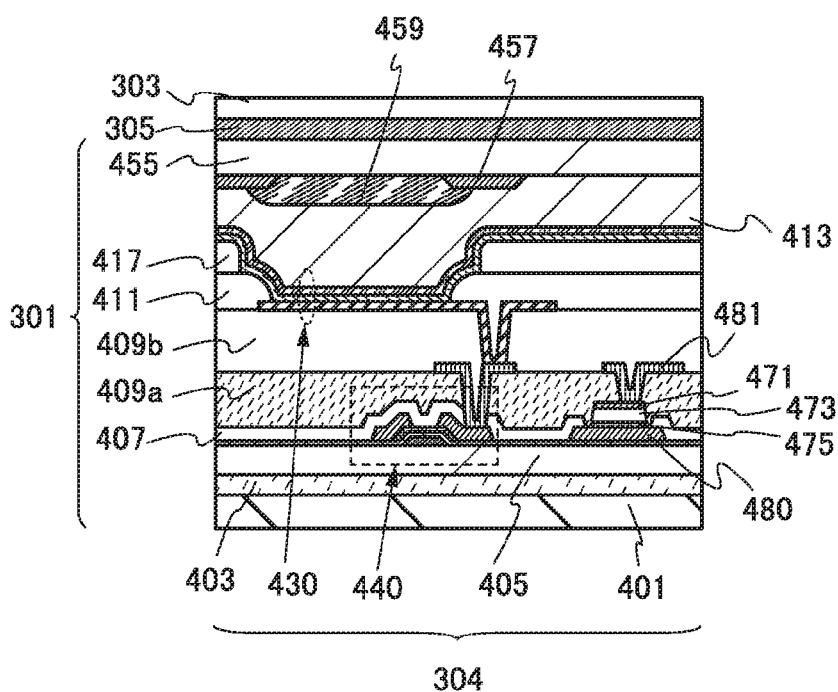

FIG. 11B shows another example of the light extraction portion 304 in the light-emitting panel. The light-emitting panel shown in FIG. 11B is capable of touch operation.

The light-emitting panel shown in FIG. 11B includes the element layer 301, the bonding layer 305, and the substrate 303. The element layer 301 includes the substrate 401, the bonding layer 403, the insulating layer 405, the transistor 440, the insulating layer 407, an insulating layer 409a, an insulating layer 409b, the light-emitting element 430, the insulating layer 411, the insulating layer 417, the sealing layer 413, the coloring layer 459, the light-blocking layer 457, a light-receiving element, a conductive layer 480, the conductive layer 481, and the insulating layer 455.

FIG. 11B shows an example in which a light-receiving element is provided between the insulating layer 405 and the sealing layer 413. Since the light-receiving element is provided between the insulating layer 405 and the sealing layer 413, a conductive layer to which the light-receiving element is electrically connected and a photoelectric conversion layer included in the light-receiving element can be formed using the same materials and the same steps as a conductive layer and a semiconductor layer included in the transistor 440. Thus, the light-emitting panel capable of touch operation can be manufactured without a significant increase in the number of manufacturing steps.

Specific Example 4

Figure 12A:
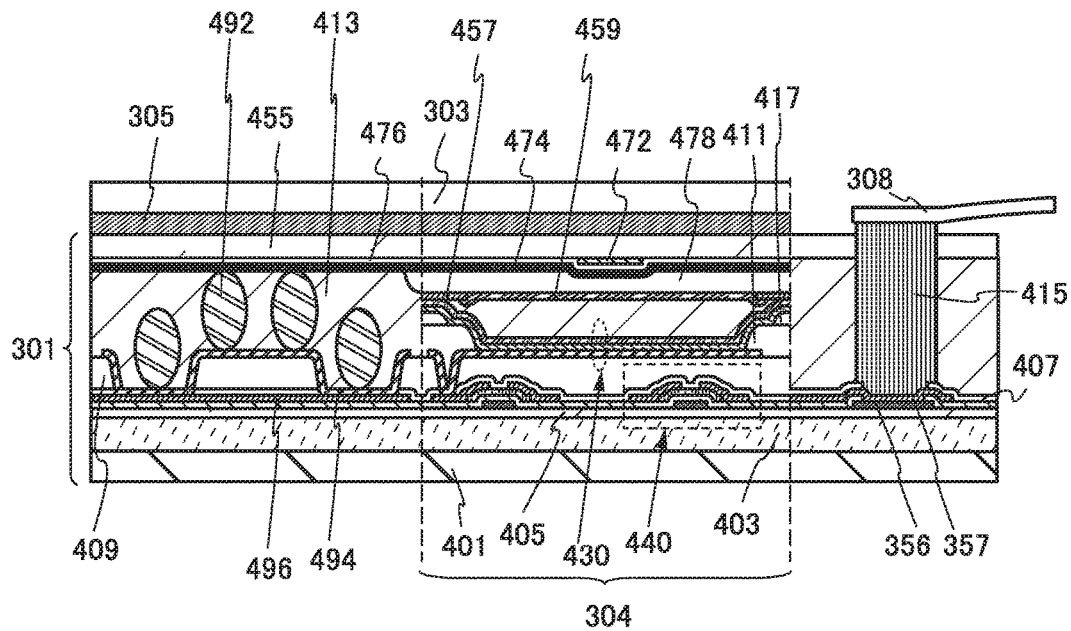
FIGS. 12A and 12B each illustrate a light-emitting panel.

FIG. 12A shows another example of the light-emitting panel. The light-emitting panel shown in FIG. 12A is capable of touch operation.

The light-emitting device shown in FIG. 12A includes the element layer 301, the bonding layer 305, and the substrate 303. The element layer 301 includes the substrate 401, the bonding layer 403, the insulating layer 405, the transistor 440, a conductive layer 356, the conductive layer 357, the insulating layer 407, the insulating layer 409, the light-emitting element 430, the insulating layer 411, the insulating layer 417, the sealing layer 413, the coloring layer 459, the light-blocking layer 457, the insulating layer 455, a conductive layer 472, a conductive layer 474, an insulating layer 476, an insulating layer 478, a conductive layer 494, and a conductive layer 496.

FIG. 12A shows an example in which a capacitive touch sensor is provided between the insulating layer 455 and the sealing layer 413. The capacitive touch sensor includes the conductive layer 472 and the conductive layer 474.

The conductive layer 356 and the conductive layer 357 are electrically connected to the FPC 308 via the connector 415. The conductive layer 494 and the conductive layer 496 are electrically connected to the conductive layer 474 via conductive particles 492. Thus, the capacitive touch sensor can be driven via the FPC 308.

Specific Example 5

Figure 12B:
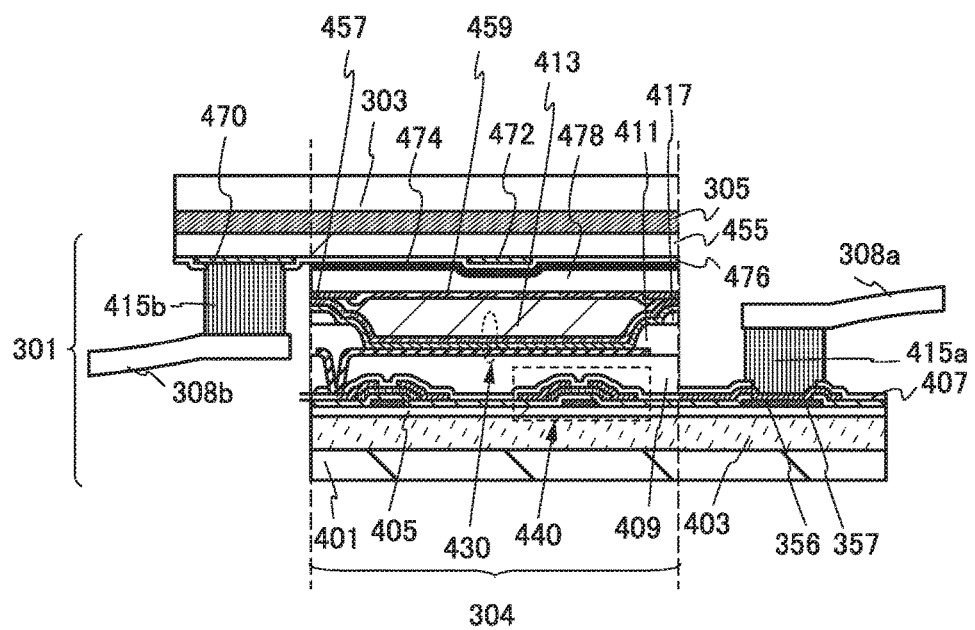

FIG. 12B shows another example of the light-emitting panel. The light-emitting panel shown in FIG. 12B is capable of touch operation.

The light-emitting panel shown in FIG. 12B includes the element layer 301, the bonding layer 305, and the substrate 303. The element layer 301 includes the substrate 401, the bonding layer 403, the insulating layer 405, the transistor 440, the conductive layer 356, the conductive layer 357, the insulating layer 407, the insulating layer 409, the light-emitting element 430, the insulating layer 411, the insulating layer 417, the sealing layer 413, the coloring layer 459, the light-blocking layer 457, the insulating layer 455, a conductive layer 470, the conductive layer 472, the conductive layer 474, the insulating layer 476, and the insulating layer 478.

FIG. 12B shows an example in which a capacitive touch sensor is provided between the insulating layer 455 and the sealing layer 413. The capacitive touch sensor includes the conductive layer 472 and the conductive layer 474.

The conductive layer 356 and the conductive layer 357 are electrically connected to an FPC 308a via a connector 415a. The conductive layer 470 is electrically connected to an FPC 308b via a connector 415b. Thus, the light-emitting element 430 and the transistor 440 can be driven via the FPC 308a, and the capacitive touch sensor can be driven via the FPC 308b.

Specific Example 6

Figure 13A:
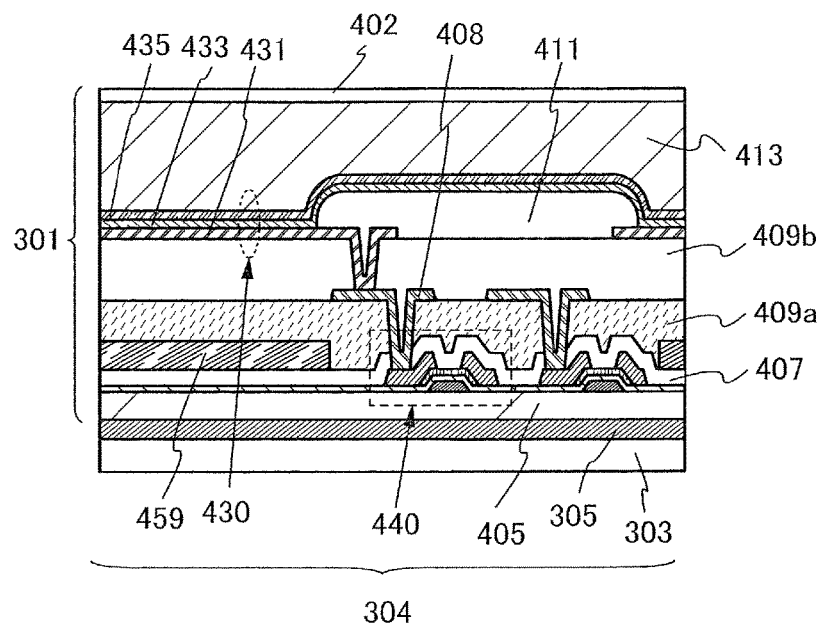
FIGS. 13A and 13B each illustrate a light-emitting panel.

FIG. 13A shows another example of the light extraction portion 304 in the light-emitting panel.

The light extraction portion 304 shown in FIG. 13A includes the substrate 303, the bonding layer 305, a substrate 402, the insulating layer 405, the transistor 440, the insulating layer 407, a conductive layer 408, the insulating layer 409a, the insulating layer 409b, the light-emitting element 430, the insulating layer 411, the sealing layer 413, and the coloring layer 459.

The light-emitting element 430 includes the lower electrode 431, the EL layer 433, and the upper electrode 435. The lower electrode 431 is electrically connected to the source electrode or the drain electrode of the transistor 440 via the conductive layer 408. An end portion of the lower electrode 431 is covered with the insulating layer 411. The light-emitting element 430 has a bottom emission structure. The lower electrode 431 has a light-transmitting property and transmits light emitted from the EL layer 433.

The coloring layer 459 is provided to overlap with the light-emitting element 430, and light emitted from the light-emitting element 430 is extracted from the substrate 303 side through the coloring layer 459. The space between the light-emitting element 430 and the substrate 402 is filled with the sealing layer 413. The substrate 402 can be formed using a material similar to that of the substrate 401.

Specific Example 7

Figure 13B:
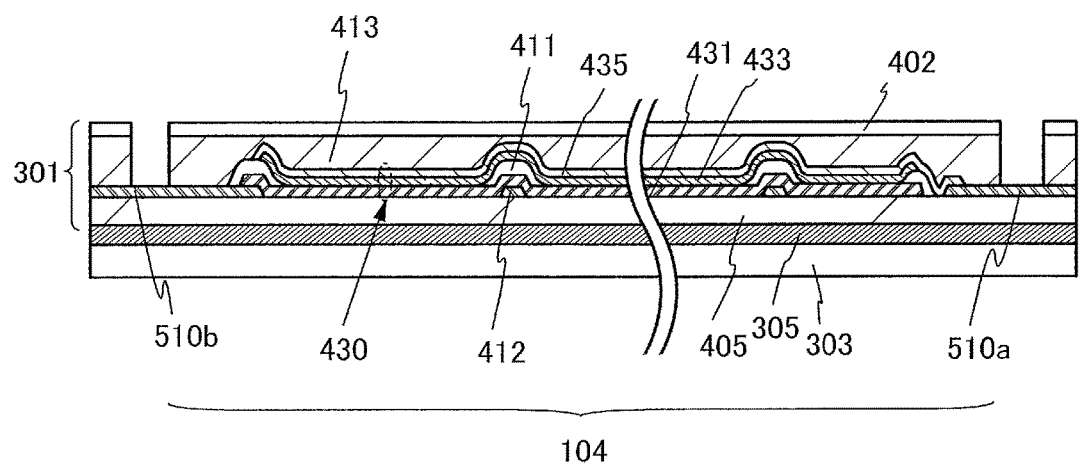

FIG. 13B shows another example of the light-emitting panel.

The light-emitting panel shown in FIG. 13B includes the element layer 301, the bonding layer 305, and the substrate 303. The element layer 301 includes the substrate 402, the insulating layer 405, a conductive layer 510a, a conductive layer 510b, a plurality of light-emitting elements, the insulating layer 411, a conductive layer 412, and the sealing layer 413.

The conductive layer 510a and the conductive layer 510b, which are external connection electrodes of the light-emitting panel, can each be electrically connected to an FPC or the like.

The light-emitting element 430 includes the lower electrode 431, the EL layer 433, and the upper electrode 435. An end portion of the lower electrode 431 is covered with the insulating layer 411. The light-emitting element 430 has a bottom emission structure. The lower electrode 431 has a light-transmitting property and transmits light emitted from the EL layer 433. The conductive layer 412 is electrically connected to the lower electrode 431.

The substrate 303 may have, as a light extraction structure, a hemispherical lens, a micro lens array, a film provided with an uneven surface structure, a light diffusing film, or the like. For example, a light extraction structure can be formed by attaching the above lens or film to a resin substrate with an adhesive or the like having substantially the same refractive index as the substrate or the lens or film.

The conductive layer 412 is preferably, though not necessarily, provided because voltage drop due to the resistance of the lower electrode 431 can be prevented. In addition, for a similar purpose, a conductive layer electrically connected to the upper electrode 435 may be provided over the insulating layer 411.

The conductive layer 412 can be a single layer or a stacked layer formed using a material selected from copper, titanium, tantalum, tungsten, molybdenum, chromium, neodymium, scandium, nickel, or aluminum, an alloy material containing any of these materials as its main component, or the like. The thickness of the conductive layer 412 can be greater than or equal to 0.1 µm and less than or equal to 3 µm, preferably greater than or equal to 0.1 µm and less than or equal to 0.5 µm.

When a paste (e.g., silver paste) is used as a material for the conductive layer electrically connected to the upper electrode 435, metal particles forming the conductive layer aggregate; therefore, the surface of the conductive layer is rough and has many gaps. Thus, it is difficult for the EL layer 433 to completely cover the conductive layer; accordingly, the upper electrode and the conductive layer are electrically connected to each other easily, which is preferable.

Examples of Materials

Next, materials and the like that can be used for the light-emitting panel are described. Note that description of the components already described in this embodiment is omitted.

The element layer 301 includes at least a light-emitting element. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The element layer 301 may further include a transistor for driving the light-emitting element, a touch sensor, or the like.

The structure of the transistors in the light-emitting panel is not particularly limited. For example, a forward staggered transistor or an inverted staggered transistor may be used. A top-gate transistor or a bottom-gate transistor may be used. A semiconductor material used for the transistors is not particularly limited, and for example, silicon or germanium can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

The light-emitting element included in the light-emitting panel includes a pair of electrodes (the lower electrode 431 and the upper electrode 435); and the EL layer 433 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium an alloy containing any of these metal materials; or a nitride of any of these metal materials (e.g., titanium nitride) can be formed thin so as to have a light-transmitting property. Alternatively, a stack of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. An alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Furthermore, when a metal film or a metal oxide film is stacked in contact with an aluminum alloy film, oxidation of the aluminum alloy film can be prevented. Examples of a material for the metal film or the metal oxide film are titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 431 and the upper electrode 435, holes are injected to the EL layer 433 from the anode side and electrons are injected to the EL layer 433 from the cathode side. The injected electrons and holes are recombined in the EL layer 433 and a light-emitting substance contained in the EL layer 433 emits light.

The EL layer 433 includes at least a light-emitting layer. In addition to the light-emitting layer, the EL layer 433 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron-transport property and a hole-transport property), and the like.

For the EL layer 433, either a low molecular compound or a high molecular compound can be used, and an inorganic compound may also be used. Each of the layers included in the EL layer 433 can be formed by any of the following methods: an evaporation method (including a vacuum evaporation method), a transfer method, a printing method, an inkjet method, a coating method, and the like.

In the element layer 301, the light-emitting element is preferably provided between a pair of insulating films with low water permeability. Thus, an impurity such as water can be prevented from entering the light-emitting element, leading to prevention of a decrease in the reliability of the light-emitting device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1 \times 10^{-5}$ [g/m$^2$·day], preferably lower than or equal to $1 \times 10^{-6}$ [g/m$^2$·day], further preferably lower than or equal to $1 \times 10^{-7}$ [g/m$^2$·day], still further preferably lower than or equal to $1 \times 10^{-8}$ [g/m$^2$·day].

The substrate 303 has a light-transmitting property and transmits at least light emitted from the light-emitting element included in the element layer 301. The substrate 303 has flexibility. The refractive index of the substrate 303 is higher than that of the air.

An organic resin, which has a specific gravity smaller than that of glass, is preferably used for the substrate 303, in which case the light-emitting device can be more lightweight as compared with the case where glass is used.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The substrate 303 may have a stacked structure of a layer of any of the above-mentioned materials and a hard coat layer (e.g., a silicon nitride layer) which protects a surface of the light-emitting device from damage or the like, a layer (e.g., an aramid resin layer) which can disperse pressure, or the like. Furthermore, to suppress a decrease in the lifetime of the light-emitting element due to moisture and the like, the insulating film with low water permeability may be included in the stacked structure.

The bonding layer 305 has a light-transmitting property and transmits at least light emitted from the light-emitting element included in the element layer 301. The refractive index of the bonding layer 305 is higher than that of the air.

For the bonding layer 305, a resin that is curable at room temperature e.g., a two-component-mixture-type resin), a light curable resin, a thermosetting resin, or the like can be used. Examples of such resins include an epoxy resin, an acrylic resin, a silicone resin, and a phenol resin. In particular, a material with low moisture permeability, such as an epoxy resin, is preferred.

Further, the resin may include a drying agent. For example, a substance that adsorbs moisture by chemical adsorption, such as oxide of an alkaline earth metal (e.g., calcium oxide or barium oxide), can he used. Alternatively, a substance that adsorbs moisture by physical adsorption, such as zeolite or silica gel, may be used. The drying agent is preferably included because it can prevent an impurity such as moisture from entering the light-emitting element, thereby improving the reliability of the light-emitting device.

In addition, it is preferable to mix a filler with a high refractive index (e.g., titanium oxide) into the resin, in which case the efficiency of light extraction from the light-emitting element can be improved.

The bonding layer 305 may also include a scattering member for scattering light. For example, the bonding layer 305 can be a mixture of the above resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, a silicone resin, or the like can he used as the resin, and titanium oxide, barium oxide, zeolite, or the like can he used as the particles.

Particles of titanium oxide or barium oxide are preferable because they scatter light excellently. When zeolite is used, it can adsorb water contained in the resin and the like, thereby improving the reliability of the light-emitting element.

The insulating layer 405 and the insulating layer 455 can each be formed using an inorganic insulating material. It is particularly preferable to use the insulating film with low water permeability, in which case a highly reliable light-emitting panel can be provided.

The insulating layer 407 has an effect of preventing diffusion of impurities into a semiconductor included in the transistor. As the insulating layer 407, an inorganic insulating film such as a silicon oxide film, a silicon oxynitride film, or an aluminum oxide film can be used.

As each of the insulating layers 409, 409a, and 409b, an insulating film with a planarization function is preferably selected in order to reduce surface unevenness due to the transistor or the like. For example, an organic material such as a polyimide resin, an acrylic resin, or a benzocyclobutene-based resin can be used. Other than such organic materials, it is also possible to use a low-dielectric constant material (a low-k material) or the like. Note that a plurality of insulating films formed of these materials or inorganic insulating films may be stacked.

The insulating layer 411 is provided to cover an end portion of the lower electrode 431. In order that the insulating layer 411 be favorably covered with the EL layer 433 and the upper electrode 435 formed thereover, a side wall of the insulating layer 411 preferably has a tilted surface with continuous curvature.

As a material for the insulating layer 411, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 411.

There is no particular limitation on the method for forming the insulating layer 411; a photolithography method, a sputtering method, an evaporation method, a droplet discharging method (e.g., an inkjet method), a printing method (e.g., a screen printing method or an off-set printing method), or the like may be used.

The insulating layer 417 can be formed using an inorganic insulating material, an organic insulating material, or the like. As the organic insulating material, for example, a negative or positive photosensitive resin, a non-photosensitive resin, or the like can be used. When a conductive material is used for the insulating layer 417 and the insulating layer 417 is electrically connected to the upper electrode 435, voltage drop due to the resistance of the upper electrode 435 can be prevented. The insulating layer 417 may have either a tapered shape or an inverse tapered shape.

Each of the insulating layers 476, 478, 491, 493, and 495 can be formed using an inorganic insulating material or an organic insulating material. It is particularly preferable to use an insulating film with a planarization function for each of the insulating layers 478 and 495 in order to reduce surface unevenness due to a sensor element.

For the sealing layer 413, a resin that is curable at room temperature (e.g., a two-component-mixture-type resin), a light curable resin, a thermosetting resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. A drying agent may be contained in the sealing layer 413. In the case where light emitted from the light-emitting element 430 is extracted outside through the sealing layer 413, the sealing layer 413 preferably includes a filler with a high refractive index or a scattering member. Materials for the drying agent, the filler with a high refractive index, and the scattering member are similar to those that can he used for the bonding layer 305.

Each of the conductive layers 356, 357, 494, and 496 can be formed using the same material and the same step as a conductive layer included in the transistor or the light-emitting element. The conductive layer 480 can be formed using the same material and the same step as a conductive layer included in the transistor.

For example, each of the conductive layers can be formed to have a single-layer structure or a stacked-layer structure using any of metal materials such as molybdenum, titanium, chromium, tantalum, tungsten, aluminum, copper, neodymium, and scandium, and an alloy material containing any of these elements. Each of the conductive layers may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

Each of the conductive layers 408, 412, 510a, and 510b can also be formed using any of the above metal materials, alloy materials, and conductive metal oxides.

Each of the conductive layers 472, 474, 481, and 483 is a conductive layer with a light-transmitting property. The conductive layer can be formed using, for example, indium oxide, ITO, indium zinc oxide, zinc oxide, zinc oxide to which gallium is added, or the like. The conductive layer 470 can be formed using the same material and the same step as the conductive layer 472.

As the conductive particles 492, particles of an organic resin, silica, or the like coated with a metal material are used, it is preferable to use nickel or gold as the metal material because contact resistance can be reduced. It is also preferable to use particles each coated with layers of two or more kinds of metal materials, such as panicles coated with nickel and further with gold.

For the connector 415, it is possible to use a paste-like or sheet-like material which is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

The coloring layer 459 is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The tight-blocking layer 457 is provided between the adjacent coloring layers 459. The light-blocking layer 457 blocks light emitted from the adjacent light-emitting element, thereby preventing color mixture between adjacent pixels. Here, the coloring layer 459 is provided such that its end portion overlaps with the light-blocking layer 457, whereby light leakage can be reduced. The light-blocking layer 457 can be formed using a material that blocks light emitted from the light-emitting element, for example, a metal material, a resin material including a pigment or a dye, or the like. Note that the light-blocking layer 457 is preferably provided in a region other than the light extraction portion 304, such as the driver circuit portion 306, as illustrated in FIG. 10B, in which case undesired leakage of guided light or the like can be prevented.

The insulating layer 461 covering the coloring layer 459 and the light-blocking layer 457 is preferably provided because it can prevent an impurity such as a pigment included in the coloring layer 459 or the light-blocking layer 457 from diffusing into the light-emitting element or the like. For the insulating layer 461, a light-transmitting material is used, and an inorganic insulating material or an organic insulating material can be used. The insulating film with low water permeability may be used for the insulating layer 461.

<Example of Manufacturing Method>

Next, an example of a method for manufacturing a light-emitting device will be described with reference to FIGS. 14A to 14C and FIGS. 15A to 15C. Here, the manufacturing method is described using the light-emitting device of Specific Example 1 (FIG. 10B) as an example.

First, a separation layer 503 is formed over a formation substrate 501, and the insulating layer 405 is formed over the separation layer 503. Next, the transistor 440, the conductive layer 357, the insulating layer 407, the insulating layer 409, the light-emitting element 430, and the insulating layer 411 are formed over the insulating layer 405. An opening is formed in the insulating layers 411, 409, and 407 to expose the conductive layer 357 (see FIG. 14A).

In addition, a separation layer 507 is formed over a formation substrate 505, and the insulating layer 455 is formed over the separation layer 507. Next, the light-blocking layer 457, the coloring layer 459, and the insulating layer 461 are formed over the insulating layer 455 (see FIG. 14B).

The formation substrate 501 and the formation substrate 505 can each be a glass substrate, a quartz substrate, a sapphire substrate, a ceramic substrate, a metal substrate, or the like.

For the glass substrate, for example, a glass material such as aluminosilicate glass, aluminoborosilicate glass, or barium borosilicate glass can be used. When the temperature of heat treatment performed later is high, a substrate having a strain point of 730° C. or higher is preferably used. Note that when containing a large amount of barium oxide (BaO), the glass substrate can be heat-resistant and more practical. Alternatively, crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 503 and the separation layer 507 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or polycrystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating film formed later can be controlled.

Each of the insulating films can be formed by a sputtering method, a plasma CVD method, a coating method, a printing method, or the like. For example, the insulating layer is formed at a temperature of higher than or equal to 250° C. and lower than or equal to 400° C. by a plasma CVD method, whereby the insulating layer can be a dense film with very low water permeability.

Figure 14A:
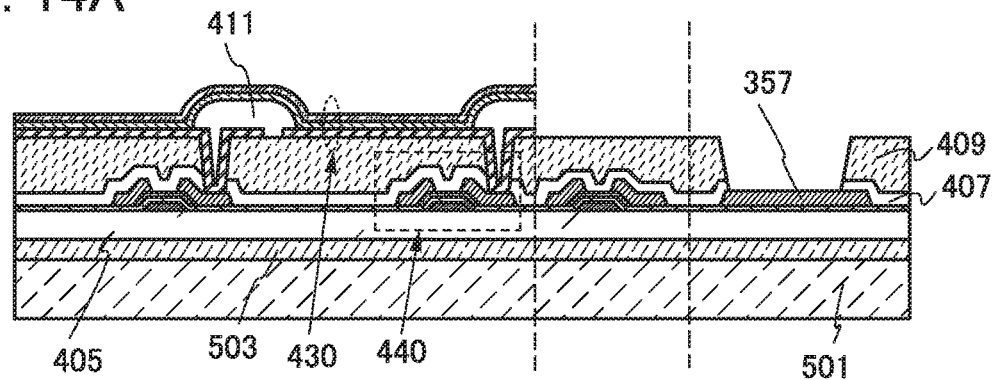
FIGS. 14A to 14C illustrate a method for manufacturing a light-emitting panel.
Figure 14B:
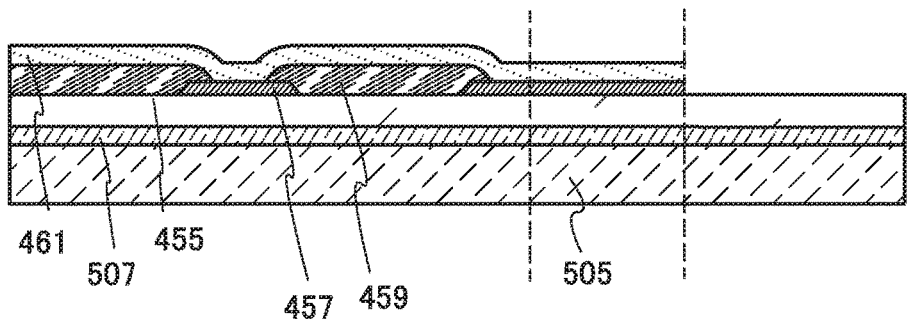
Figure 14C:
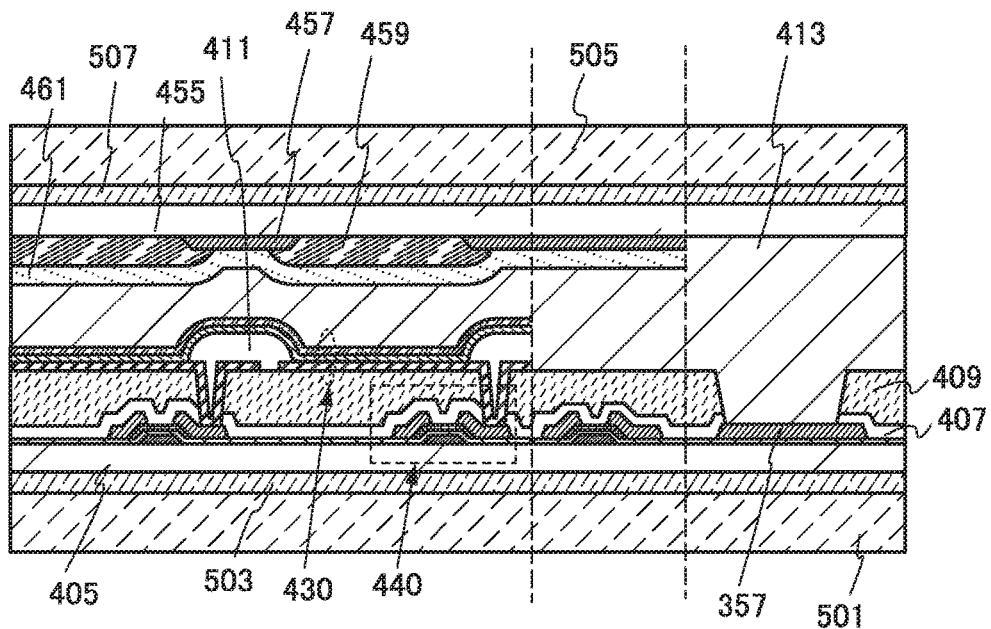

Then, a material for the sealing layer 413 is applied to a surface of the formation substrate 505 over which the coloring layer 459 and the like are formed or a surface of the formation substrate 501 over which the light-emitting element 430 and the like are formed, and the formation substrate 501 and the formation substrate 505 are attached with the sealing layer 413 positioned therebetween (see FIG. 14C).

Next, the formation substrate 501 is separated, and the exposed insulating layer 405 and the substrate 401 are attached to each other with the bonding layer 403. Furthermore, the formation substrate 505 is separated, and the exposed insulating layer 455 and the substrate 303 are attached to each other with the bonding layer 305. Although the substrate 303 does not overlap with the conductive layer 357 in FIG. 15A, the substrate 303 may overlap with the conductive layer 357.

Any of a variety of methods can be used as appropriate for the separation process. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between the formation substrate having high heat resistance and the layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as a gas, thereby promoting separation between the layer to be separated and the formation substrate. Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

Furthermore, the separation process can be conducted easily by combination of the above-described separation methods. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated can be easily separated from each other.

Separation of the layer to be separated from the formation substrate may be carried out by filling the interface between the separation layer and the layer to be separated with a liquid. Furthermore, the separation may be conducted while pouring a liquid such as water.

As another separation method, in the case where the separation layer is formed using tungsten, it is preferable that the separation be performed while etching the separation layer using a mixed solution of ammonium water and a hydrogen peroxide solution.

Note that the separation layer is not necessary in the case where separation at the interface between the formation substrate and the layer to be separated is possible. For example, glass is used as the formation substrate, an organic resin such as polyimide is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated.

Figure 15A:
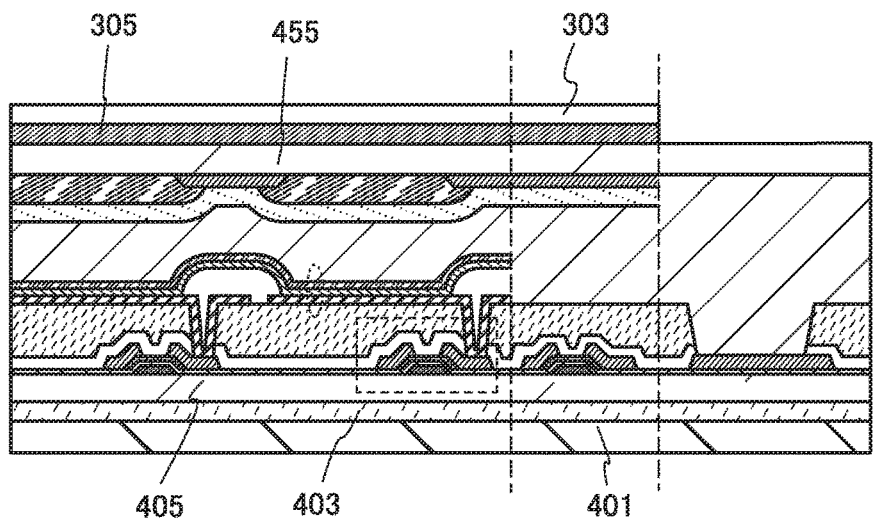
FIGS. 15A to 15C illustrate a method for manufacturing a light-emitting panel.
Figure 15B:
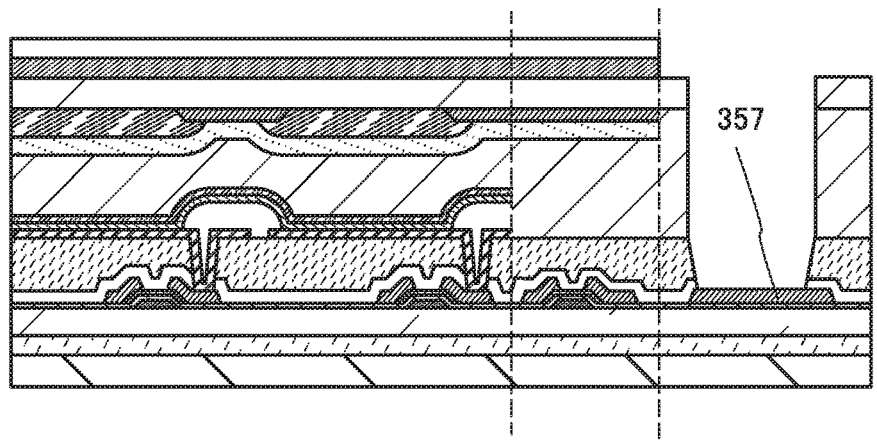
Figure 15C:
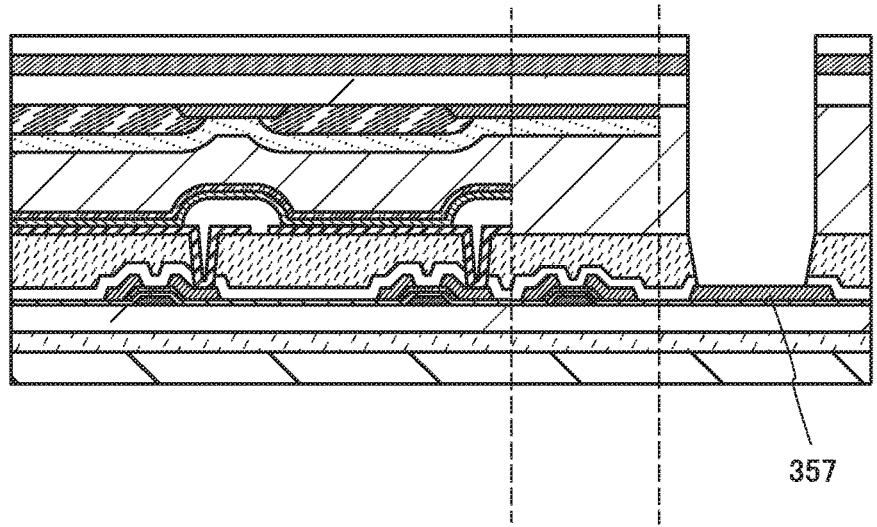

Lastly, an opening is formed in the insulating layer 455 and the sealing layer 413 to expose the conductive layer 357 (see FIG. 15B). In the case where the substrate 303 overlaps with the conductive layer 357, the opening is formed also in the substrate 303 and the bonding layer 305 (see FIG. 15C). The method for forming the opening is not particularly limited and may be, for example, a laser ablation method, an etching method, an ion beam sputtering method, or the like. As another method, a cut may be made in a film over the conductive layer 357 with a sharp knife or the like and part of the film may be separated by physical force.

In the above-described manner, the light-emitting panel can be manufactured.

As described above, the light-emitting panel of this embodiment includes two substrates; one is the substrate 303 and the other is the substrate 401 or the substrate 402. The light-emitting panel can be formed with two substrates even when including a touch sensor. Owing to the use of the minimum number of substrates, improvement in light extraction efficiency and improvement in clarity of display can be easily achieved.

Examples of the electronic devices to which the flexible light-emitting device is applied include television sets (also referred to as televisions or television receivers), monitors of computers or the like, cameras such as digital cameras or digital video cameras, digital photo frames, mobile phones (also referred to as cellular phones or cellular phone devices), portable game consoles, portable information terminals, audio reproducing devices, large-sized game machines such as pachinko machines, and the like.

This embodiment can be implemented in an appropriate combination with any of the structures described in the other embodiments.

This application is based on Japanese Patent Application serial no. 2013-150236 filed with Japan Patent Office on Jul. 19, 2013, the entire contents of which are hereby incorporated by reference.

What is claimed is:

1. A support of a flexible component comprising:
a first substrate and a second substrate; and
a first hinge comprising a first hinge piece and a second hinge piece,
wherein the second substrate comprises a first side and a second side opposite to the first side,
wherein the first hinge piece is fixed to the first substrate,
wherein the second hinge piece is fixed to the first side of the second substrate, and
wherein when the support is being bent, the second hinge piece is configured to slide parallel with respect to the second substrate in a direction toward the second side.

2. The support according to claim 1,
wherein a first slide function is provided in the second hinge piece, and
wherein the second substrate is configured to move in a horizontal direction with the first slide function.

3. The support according to claim 1, further comprising:
a first rack and a first pinion mechanically connected to each other,
wherein the first hinge further comprises a first shaft,
wherein the first rack is fixed to the first side of the second substrate,
wherein a center of the first pinion is fixed to the first shaft, and
wherein the first shaft is fixed to the first hinge piece.

4. The support according to claim 3, further comprising:
a third substrate; and
a second hinge comprising a third hinge piece and a fourth hinge piece,
wherein the second substrate is fixed to the fourth hinge piece, and
wherein the third substrate is connected to the third hinge piece so that the third substrate slides with respect to the third hinge piece when the third substrate is rotated with respect to the second substrate.

5. The support according to claim 4, further comprising:
a second rack;
a second pinion;
a third pinion; and
an intermediate gear,
wherein the second rack is fixed to a corner of the third substrate,
wherein a center of the second pinion is fixed to a second shaft which is fixed to the third hinge piece,
wherein a center of the third pinion is fixed to a fourth shaft which is fixed to the fourth hinge piece,
wherein teeth of the second pinion and teeth of the third pinion engage with each other through the intermediate gear,
wherein a center of the intermediate gear is fixed to a third shaft which is fixed to the third hinge piece, and
wherein the second rack and the second pinion are mechanically connected to each other.

6. A light-emitting device comprising:
the support according to claim 1; and
one flexible component which is fixed to the first substrate and the second substrate.

7. The support according to claim 1, wherein the first substrate and the second substrate are connected to each other with two sets of the first hinge.

8. A support of a flexible component comprising:
a first substrate and a second substrate; and
a first hinge comprising a first hinge piece and a second hinge piece,
wherein the first hinge piece is fixed to a first side of the first substrate,
wherein the second hinge piece is fixed to a first side of the second substrate,
wherein a third side of the first substrate which is perpendicular to the first side of the first substrate and a third side of the second substrate which is perpendicular to the first side of the second substrate are the same length,
wherein a second side of the first substrate is opposite of the first side of the first substrate,
wherein a second side of the second substrate is opposite of the first side of the second substrate, and
wherein, when the support is in a bent state, the first substrate overlaps with the second substrate and the second side of the second substrate is between the first side of the first substrate and the second side of the first substrate when seen from a direction which is perpendicular to a surface of the second substrate.

9. The support according to claim 8,
wherein a first slide function is provided in the second hinge piece, and
wherein the second substrate is configured to move in a horizontal direction with the first slide function.

10. The support according to claim 8, further comprising:
a first rack and a first pinion mechanically connected to each other,
wherein the first hinge further comprises a first shaft,
wherein the first rack is fixed to the first side of the second substrate,
wherein a center of the first pinion is fixed to the first shaft, and
wherein the first shaft is fixed to the first hinge piece.

11. The support according to claim 10, further comprising:
a third substrate; and
a second hinge comprising a third hinge piece and a fourth hinge piece, wherein the second substrate is fixed to the fourth hinge piece, and wherein the third substrate is connected to the third hinge piece so that the third substrate slides with respect to the third hinge piece when the third substrate is rotated with respect to the second substrate.

12. The support according to claim 11, further comprising:
a second rack;
a second pinion;
a third pinion; and
an intermediate gear,
wherein the second rack is fixed to a corner of the third substrate,
wherein a center of the second pinion is fixed to a second shaft which is fixed to the third hinge piece,
wherein a center of the third pinion is fixed to a fourth shaft which is fixed to the fourth hinge piece,
wherein teeth of the second pinion and teeth of the third pinion engage with each other through the intermediate gear,
wherein a center of the intermediate gear is fixed to a third shaft which is fixed to the third hinge piece, and
wherein the second rack and the second pinion are mechanically connected to each other.

13. A light-emitting device comprising:
the support according to claim 8; and
one flexible component which is fixed to the first substrate and the second substrate.

14. The support according to claim 8, wherein the first substrate and the second substrate are connected to each other with two sets of the first hinge.

15. A light-emitting device comprising:
a support comprising a first substrate, a second substrate and a first hinge; and
a flexible light-emitting device comprising a first region, a second region and a third region between the first region and the second region,
wherein the first hinge comprises a first hinge piece and a second hinge piece,
wherein the first region of the flexible light-emitting device is fixed to the first substrate,
wherein the second region of the flexible light-emitting device is fixed to the second substrate,
wherein the second substrate comprises a first side and a second side opposite to the first side,
wherein the first hinge piece is fixed to the first substrate,
wherein the second hinge piece is fixed to the first side of the second substrate, and
wherein when the support is being bent, the second hinge piece is configured to slide with respect to the second substrate in a direction toward the second side.

16. The light-emitting device according to claim 15, wherein a first slide function is provided in the second hinge piece, and
wherein the second substrate is configured to move in a horizontal direction with the first slide function.

17. The light-emitting device according to claim 15, further comprising:
a first rack and a first pinion mechanically connected to each other,
wherein the first hinge further comprises a first shaft,
wherein the first rack is fixed to the first side of the second substrate,
wherein a center of the first pinion is fixed to the first shaft, and
wherein the first shaft is fixed to the first hinge piece.

18. The light-emitting device according to claim 17, further comprising:
a third substrate; and
a second hinge comprising a third hinge piece and a fourth hinge piece,
wherein the second substrate is fixed to the fourth hinge piece, and
wherein the third substrate is connected to the third hinge piece so that the third substrate slides with respect to the third hinge piece when the third substrate is rotated with respect to the second substrate.

19. The light-emitting device according to claim 18,
a second rack;
a second pinion;
a third pinion; and
an intermediate gear,
wherein the second rack is fixed to a corner of the third substrate,
wherein a center of the second pinion is fixed to a second shaft which is fixed to the third hinge piece,
wherein a center of the third pinion is fixed to a fourth shaft which is fixed to the fourth hinge piece,
wherein teeth of the second pinion and teeth of the third pinion engage with each other through the intermediate gear,
wherein a center of the intermediate gear is fixed to a third shaft which is fixed to the third hinge piece, and
wherein the second rack and the second pinion are mechanically connected to each other.

20. The support according to claim 19,
wherein the first substrate and the second substrate are connected to each other with two sets of the first hinge, the first rack, and the first pinion, and
wherein the second substrate and the third substrate are connected to each other with two sets of the second hinge, the second rack, the second pinion, the third pinion, and the intermediate gear.

21. The support according to claim 19,
wherein the first rack and the first pinion are provided over one surface of the second substrate, and
wherein the third pinion is provided over the other surface of the second substrate.

22. The light-emitting device according to claim 15, wherein the first substrate and the second substrate are connected to each other with two sets of the first hinge.

* * * * *